United States Patent
Peterson et al.

(10) Patent No.: US 6,634,890 B2
(45) Date of Patent: Oct. 21, 2003

(54) SPRING-LOADED HEAT SINK ASSEMBLY FOR A CIRCUIT ASSEMBLY

(75) Inventors: Eric C. Peterson, McKinney, TX (US); S. Daniel Cromwell, Penryn, CA (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 26 days.

(21) Appl. No.: 09/972,545

(22) Filed: Oct. 8, 2001

(65) Prior Publication Data

US 2002/0076974 A1 Jun. 20, 2002

Related U.S. Application Data

(63) Continuation-in-part of application No. 09/549,983, filed on Apr. 14, 2000, now Pat. No. 6,299,460.
(51) Int. Cl.[7] .............................................. H01R 12/00
(52) U.S. Cl. ...................................................... 439/67
(58) Field of Search .............................. 439/66, 68, 69, 439/70, 71, 67, 591, 630, 592, 631, 91

(56) References Cited

U.S. PATENT DOCUMENTS

| | | | | |
|---|---|---|---|---|
| 5,794,685 A | * | 8/1998 | Dean | 165/21 |
| 5,886,870 A | * | 3/1999 | Omori | 361/704 |
| 6,011,331 A | * | 1/2000 | Gierer et al. | 310/58 |

* cited by examiner

Primary Examiner—Jean F. Duverne

(57) ABSTRACT

A spring-loaded heat sink assembly for a circuit assembly, an installation tool, and a method of installation. The assembly comprises a heat sink, a load plate, and at least one leaf spring positioned therebetween. The load plate comprises elongate shafts having an open channel therethrough which extend through the leaf spring(s) and heat sink and at least partially through the circuit assembly. The elongate shafts provide a space for the leaf spring(s) between the heat sink and load plate. Fasteners extend through the elongate shafts to connect the spring-loaded heat sink assembly to the circuit assembly.

10 Claims, 16 Drawing Sheets

SPRING-LOADED HEAT SINK ASSEMBLY FOR A CIRCUIT ASSEMBLY

CROSS-REFERENCE TO RELATED APPLICATION

The present application is a continuation-in-part of U.S. patent application Ser. No. 09/549,983 filed Apr. 14, 2000 now U.S. Pat. No. 6,299,460 for SPRING-LOADED BACKING PLATE ASSEMBLY FOR USE WITH LAND GRID ARRAY-TYPE DEVICES of Jeffrey T. Haselby et al., which is hereby specifically incorporated by reference for all that is disclosed therein.

FIELD OF THE INVENTION

The present invention relates generally to electronic circuit assemblies including land grid array-type devices, and more particularly to biasing assemblies for an electronic circuit assembly that includes a land grid array-type device and a heat sink.

BACKGROUND OF THE INVENTION

Printed circuit boards are generally formed of a rigid dielectric material which is printed with a predetermined pattern of an electrical conductor. Printed circuit boards may be electrically connected to one or more land grid array-type devices such as an application specific integrated circuit (ASIC) or a flexible printed circuit having an array of electrically conductive pads thereon. In order to electrically connect a land grid array-type device to a printed circuit board, an electrical connector or "socket" may be disposed therebetween which has an array of electrically conductive pads on each side thereof. The electrically conductive pads may be constructed from an elastomeric material. The pads on one side of the connector abut with the pads on the land grid array-type device, and the pads on the other side of the connector abut with the electrically conductive array on the printed circuit board.

In order to maintain electrical connection between a land grid array-type device and a printed circuit board, the device and the board must be compressed together, with the electrical connector therebetween. Such an assembly 10 is shown in FIG. 1. The surfaces 12, 14, respectively, of the device 20 (an ASIC being shown in this figure and the board 22 that the electrical connector 24 is in between must each be flat to within a few mils of an inch. When pads 26, 28 (shown greatly enlarged for illustrative purposes) on an electrical connector 24 are compressed between a land grid array-type device 20 and a printed circuit board 22, these pads 26 (especially elastomeric ones) act as miniature springs, exerting forces "F0" opposing the compression of the device 20 and the board 22. Existing large-area connector arrays generate large forces between the printed circuit board and the device being attached to the board. These forces are often large enough to deflect the printed circuit board outside of the flatness requirements. Thus, in addition to needing a relatively large compressive force to maintain contact between the device, the connector and the board, a backing plate 30, FIG. 1, is required to support the printed circuit board 22 and maintain the flatness of the front surface 14 thereof. As shown in FIG. 1, such a backing plate 30 is usually positioned on the back side 16 of the printed circuit board 22, opposite the electrical connector 24 and land grid array-type device 20. A second backing plate 32, which may be part of a heat sink (not shown) or the like, may be positioned adjacent to the land grid array-type device 20.

As shown in FIG. 1, a biasing assembly 34 such as springs 36, 38 is generally required to maintain a large, relatively constant force "F1" on the board, connector and device. Such a biasing assembly 34 is usually placed on the top side 14 of the printed circuit board 22, adjacent to the second backing plate 32, as shown in FIG. 1. In general, with a linear spring, the force "F" provided by a spring is directly proportional to the spring constant "K" multiplied by the linear deflection "X" (F=KX). A spring having a low spring constant "K" is most desirable in this application in order to keep the spring force as consistent as possible. Specifically, manufacturing tolerances can vary among different installations. In addition, changes in environmental conditions such as temperature and creep of various components may cause the spring to deflect. Because of F=KX, a large spring constant "K" multiplied by even a small change in deflection "X" of the spring would produce a relatively large fluctuation in the force "F" provided by the spring.

Since a large force "F" is required and a low spring constant "K" is most desirable, the linear deflection "X" of any linear spring used in this application must be large. Furthermore, since a spring with more coils deflects a greater total distance than the same type of spring with fewer coils, a coil spring used in this application must be relatively long. Specifically with reference to FIG. 1, in order to provide a sufficient force "F1" to oppose the large forces "F0" generated by the pads 26 on the electrical connector 24, the length "L1" of each spring 36, 38 (shown compressed) must be relatively large. In today's small, densely-packed computers and electronics, the distance required for such springs 36, 38 may not be available on the top side 14 of a printed circuit board 22. Even if such a distance is available, providing a more compact biasing assembly is more desirable.

Oftentimes, a heat sink must be installed over an electrical component such as a land grid array-type device in order to dissipate heat generated by the device. A heat sink is typically constructed from a heat conductive material such as, for example, aluminum, magnesium, or copper, and has a base portion with a plurality of cooling fins attached thereto. The base portion typically draws heat from the electrical component and then spreads and transfers the heat to the cooling fins. The base of a heat sink is typically positioned directly adjacent to the land grid array-type device, possibly with thermal interface material therebetween.

Adding a heat sink to an electronic circuit assembly presents the further problem of providing a thermal connection between a heat sink and a land grid array-type device while also providing an electrical connection between the land grid array-type device, an electrical connector, and a printed circuit board. A biasing assembly (e.g., 34 described above) is generally required to provide a compressive force in order to maintain the necessary connections between the heat sink, land grid array-type device, electrical connector, and printed circuit board. However, during installation thereof, the force must be applied as uniformly as possible to avoid rocking and possibly damaging the land grid array-type device, electrical connector, and printed circuit board.

Thus, it is an object of the present invention to provide a backing plate assembly which includes a biasing assembly to provide a constant compressive force on a printed circuit board, electrical connector and land grid array-type device.

It is also an object of the present invention to provide a heat sink assembly which includes a biasing assembly to provide a constant compressive force on a heat sink, printed circuit board, electrical connector and land grid array-type device.

It is a further object of the present invention to provide a biasing assembly having a relatively low spring constant which provides a relatively large compressive force on a heat sink (if present), printed circuit board, electrical connector, and land grid array-type device, yet does not require a relatively large distance on the top or bottom side of the printed circuit board.

It is also an object of the present invention to provide a spring-loaded backing plate assembly as a single, compact unit positioned on the back side of a printed circuit board.

It is a further object of the present invention to use a simple, relatively low-cost leaf spring assembly, rather than a coil spring assembly, as the biasing assembly in a spring-loaded backing plate or heat sink assembly.

It is a further object of the present invention to provide a spring-loaded backing plate or heat sink assembly which provides a predetermined, constant force upon every installation thereof in a circuit assembly.

It is a further object of the present invention to provide a method for installing a spring-loaded heat sink assembly on a circuit assembly which applies biasing force in a uniform manner and prevents rocking of the components.

It is a further object of the present invention to provide a tool for installing a spring-loaded heat sink assembly which releases the biasing force in a uniform manner and prevents rocking of the components.

SUMMARY OF THE INVENTION

In accordance with these and other objects, the present invention is directed to a spring-loaded heat sink assembly for a circuit assembly. The assembly may comprise a heat sink having a base portion, a plurality of cooling fins, and an uppermost surface on the cooling fins. At least one leaf spring may be positioned adjacent to the uppermost surface of the heat sink. The assembly may further comprise a load plate positioned adjacent to the leaf spring(s). The load plate may comprise a plurality of elongate shafts fixedly attached thereto. The elongate shafts removably extend through the leaf spring and the heat sink and at least partially through the circuit assembly. Each of the elongate shafts has an open channel extending therethrough. The assembly may further comprise a plurality of fasteners extending through the open channel of the elongate shafts and at least partially through the circuit assembly. The fasteners removably connect the spring-loaded heat sink assembly to the circuit assembly.

The present invention is also directed to a spring-loaded heat sink assembly and circuit assembly, whereby the circuit assembly has at least a printed circuit board, an electrical connector, and a land grid array-type device. The assembly may comprise a heat sink having a base portion in thermal contact with the land grid array-type device and a plurality of cooling fins. At least one leaf spring may be positioned adjacent to the cooling fins. The assembly may further comprise a load plate positioned adjacent to the leaf spring(s). A plurality of elongate shafts may extend through the heat sink and leaf spring(s) from the load plate to at least the land grid array-type device. The assembly may further comprise a plurality of fasteners extending through an open channel in the elongate shafts, thereby removably connecting the spring-loaded heat sink assembly to the circuit assembly. The circuit assembly may further comprise an electromagnetic interference frame mounted on the printed circuit board and a backing plate. If so, the elongate shafts may extend from the load plate to the electromagnetic interference frame. The fasteners may extend through the electromagnetic interference frame and the printed circuit board and be removably attached to the backing plate.

The present invention is also directed to an installation tool for attaching a spring-loaded heat sink assembly to a circuit assembly. The installation tool may comprise an upper portion, a first side portion, and a second side portion. The tool may further comprise an attachment pin removably inserted through the first side portion and the second side portion extending from and separated by the upper portion. The tool may further comprise a lower plate and an actuation device extending through the upper portion and contacting the upper surface of the lower plate. The actuation device is adjustable in order to move the lower plate relative to the upper portion of the tool. The tool may further comprise at least one fastener movably connecting the lower plate to the upper portion.

The present invention is also directed to a method for installing a spring-loaded heat sink assembly on a circuit assembly using an installation tool. The method may comprise the initial step of assembling a heat sink, at least one leaf spring, and load plate. The next step may involve mounting an installation tool on the heat sink assembly. The next step may involve lowering an actuation device on the installation tool in order to compress the leaf spring(s). The next step may involve positioning the heat sink assembly and attached installation tool on the circuit assembly. The next step may involve inserting fasteners through the heat sink assembly and at least partially through the circuit assembly in order to attach the heat sink assembly to the circuit assembly. A final step may involve removing the attachment pin and installation tool from the heat sink assembly.

BRIEF DESCRIPTION OF THE DRAWINGS

Illustrative and presently preferred embodiments of the invention are shown in the accompanying drawings in which.

DETAILED DESCRIPTION OF THE INVENTION

Figure 2:
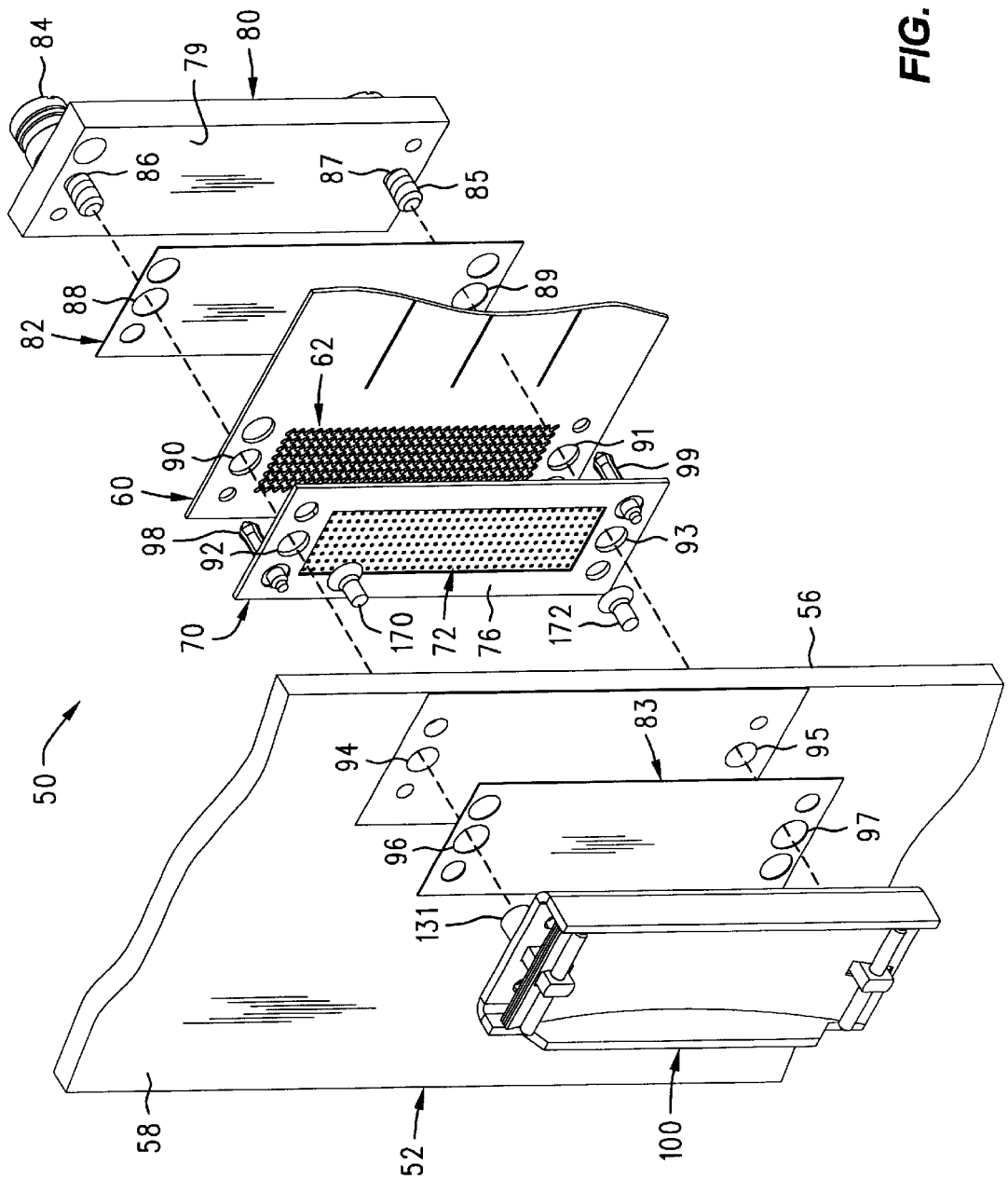
FIG. 2 is an exploded isometric view of a circuit assembly utilizing the spring-loaded backing plate of the present invention.
Figure 3:
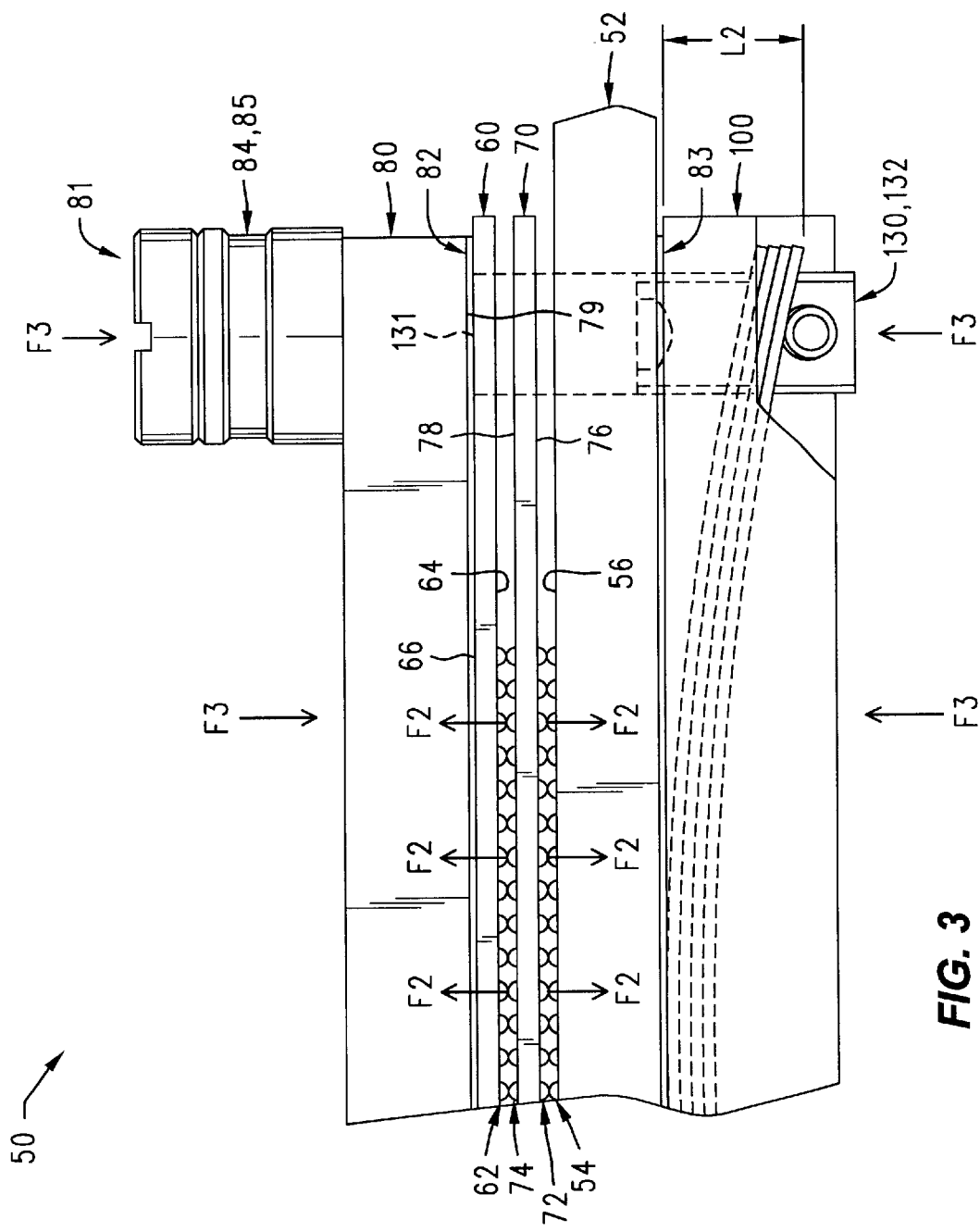
FIG. 3 is a side view of the circuit assembly of FIG. 2.

FIGS. 2 and 3 illustrate a typical circuit assembly 50 utilizing the spring-loaded backing plate assembly 100 of the present invention. The circuit assembly 50 may comprise a printed circuit board 52 with a front side 56, a back side 58 and an array 54 of electrically conductive portions (shown greatly enlarged in FIG. 3 for illustrative purposes) on the front side 56 thereof. The spring-loaded backing plate assembly 100 is positioned adjacent to the back side 58 of the printed circuit board 52 in order to provide support thereto. To assist in aligning the spring-loaded backing plate assembly 100 to the printed circuit board 52, the printed circuit board 52 may have a screen-printed outline of the spring-loaded backing plate assembly 100 on the back side 58 thereof as shown in FIG. 2.

The circuit assembly 50 may further comprise a land grid array-type device 60 which may be electrically connected to the printed circuit board 52 using an electrical connector 70. The land grid array-type device 60 may be any device such as, for example, the flex circuit shown in FIG. 2 or an ASIC, with an array 62 of electrically conductive portions (shown greatly enlarged in FIG. 3 for illustrative purposes) on the front side 64 thereof. The electrical connector 70 or "socket" may of a type well-known in the art which comprises an array 72, 74 of electrically conductive portions (shown greatly enlarged in FIG. 3 for illustrative purposes) on each side 76, 78, respectively, thereof. The electrically conductive portions 72, 74 may be constructed from an elastomeric material, although any type of socket may be used with the spring-loaded backing plate 100 of the present invention.

When assembled, the array 72 on the first side 76 of the electrical connector 70 abuts the array 54 on the front side 56 of the printed circuit board 52, and the array 74 (FIG. 3) on the second side 76 of the electrical connector 70 abuts an array 62 of electrically conductive portions on the land grid array-type device 60. As shown in FIG. 2 and described above, the pads 72, 74 (in particular, elastomeric pads) tend to create an anti-compressive force, i.e., the pads 72, 74 generate a force "F2" which push against the front sides 56, 64, respectively, of the printed circuit board 52 and the land grid array-type device 60, opposing the compression of the board 52 and device 60.

A second backing plate 80 may be included in the assembly 50 in order to support the land grid array-type device 60 on the back side 66 thereof. It should be noted that the second backing plate 80 may be comprised of any component that provides support to the device 60. For example, the second backing plate 80 may be part of a heat sink (not shown) or the like which includes a stiff plate member. As shown in FIGS. 2 and 3, an insulator 82 may be disposed between the land grid array-type device 60 and the second backing plate 80 to avoid electrical contact between the second backing plate 80 and the land grid array-type device 60. An insulator 83 may also be disposed between the spring-loaded backing plate assembly 100 and the printed circuit board 52 to avoid electrical contact therebetween. It should be noted that the second backing plate 80 may be comprised of any device which provides support to the land grid array-type device 60, such as a heat sink assembly (not shown) or the like.

In an alternate embodiment (not shown), the spring-loaded backing plate assembly 100 may be positioned adjacent to the back side 66 of the land grid array-type device 60, while the second backing plate 80 may be positioned adjacent to the back side 56 of the printed circuit board 52.

Figure 1:
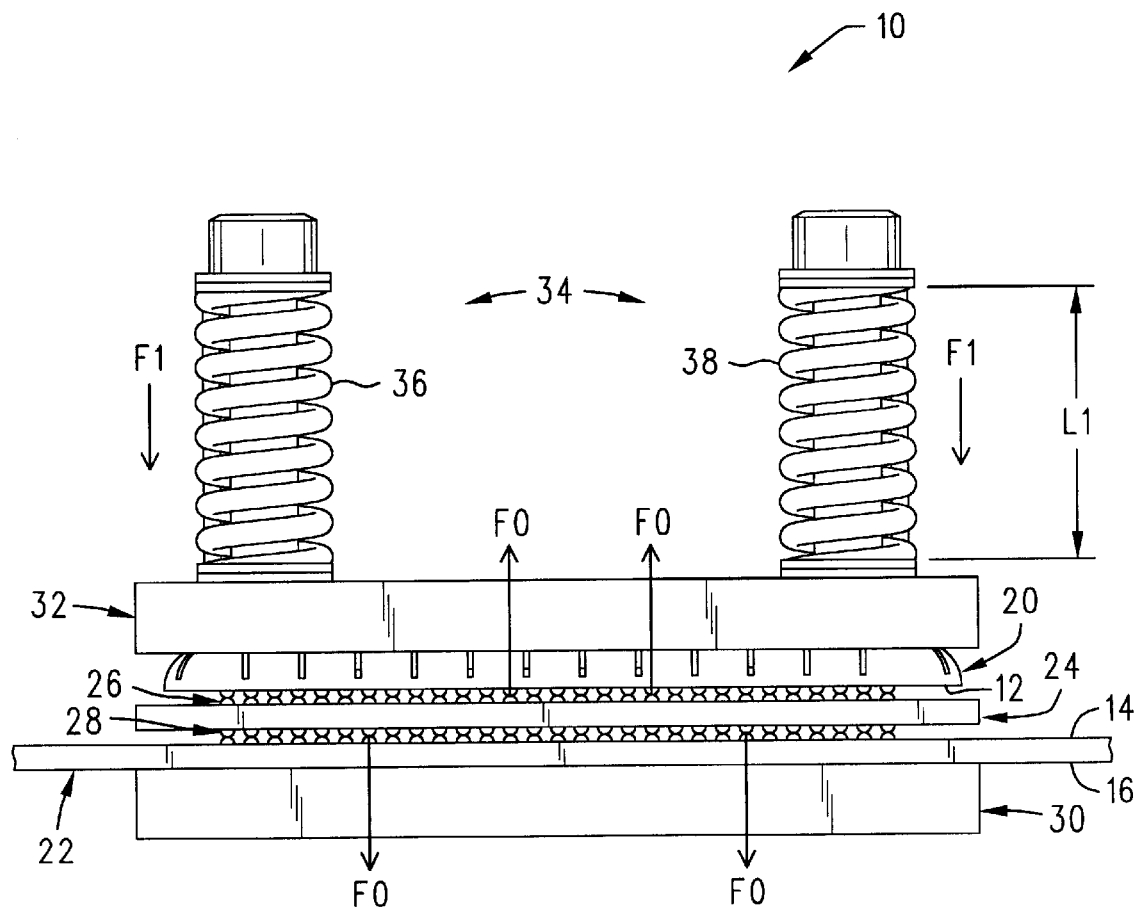
FIG. 1 is a side view of a prior art circuit assembly.

A connector assembly 81 (FIG. 3) may also be included in order to connect the spring-loaded backing plate assembly 100 of the present invention to the circuit assembly 50. The connector assembly 81 may comprise internally-threaded posts 130, 132 (which are part of the spring-loaded backing plate assembly 100 described in further detail below) and fasteners 84, 85 such as captive screws adapted to be attached to the posts 130, 132. As shown in FIG. 1, the connector assembly 81 may extend through openings 86, 87, 88, 89, 90, 91, 92, 93, 94, 95, 96, 97 (FIG. 2) in the second backing plate 80, insulator 82, land grid array-type device 60, electrical connector 70, and printed circuit board 52, and openings 110 and 112 (FIG. 4) in the spring-loaded backing plate assembly 100.

As shown in FIG. 2, the circuit assembly 50 may further comprise fasteners 98, 99 such as pronged pins or the like which are adapted to connect together the electrical connector 70, the land grid array-type device 60, the second backing plate 80 and insulator 82 prior to installing them onto the printed circuit board 52.

Figure 4:
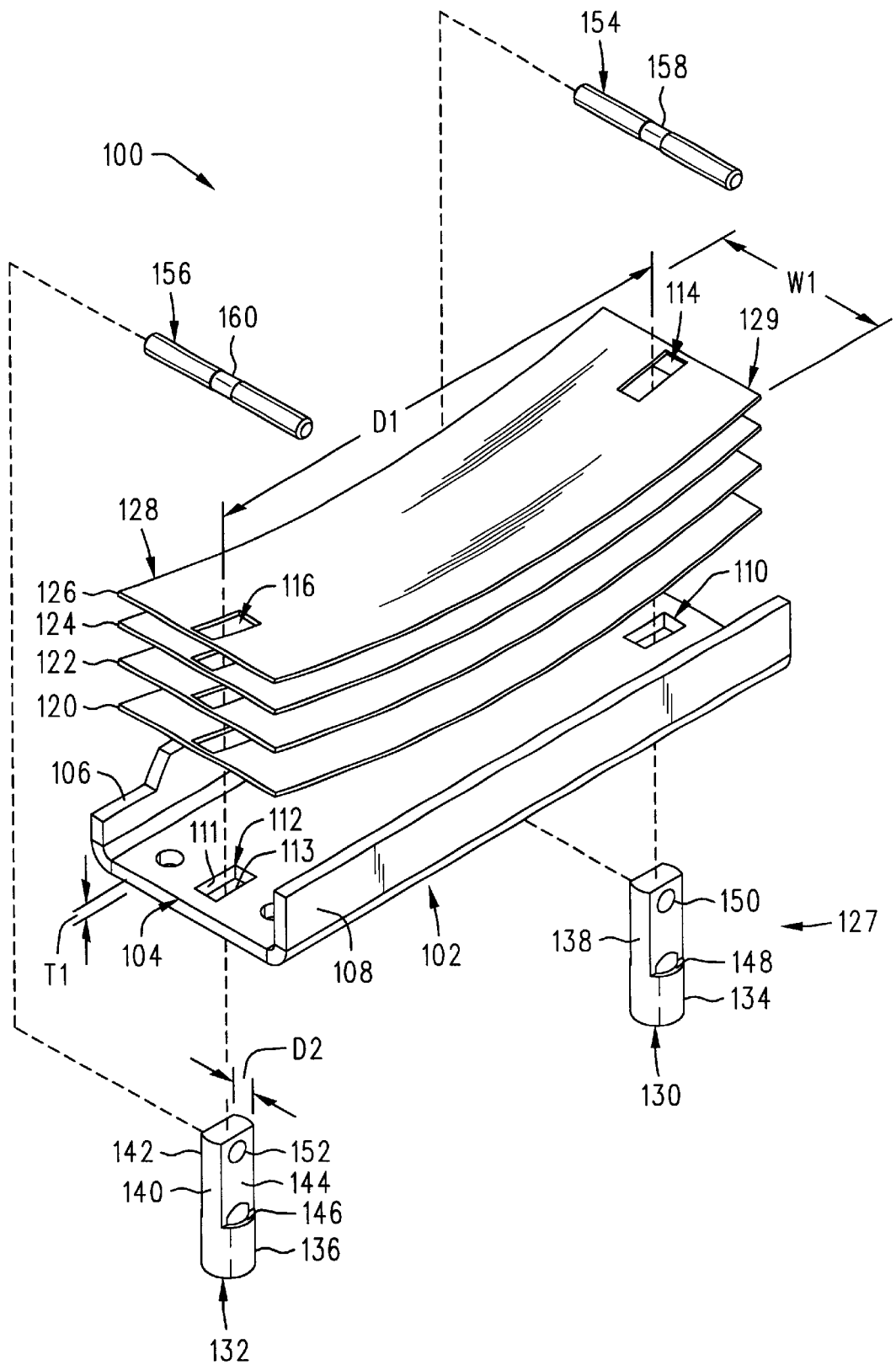
FIG. 4 is an exploded isometric view of the spring-loaded backing plate of FIG. 2.
Figure 5:
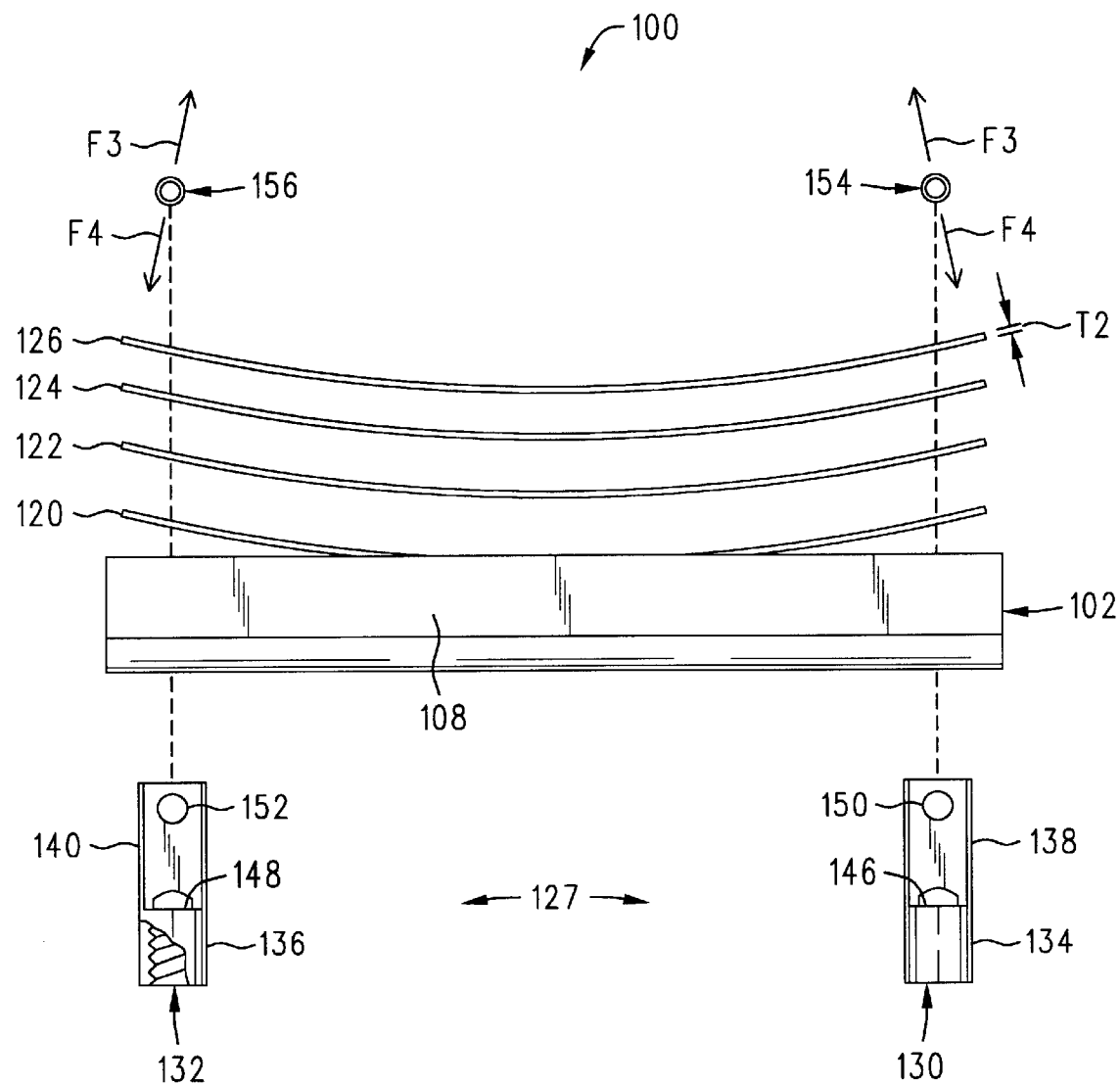
FIG. 5 is an exploded side view of the spring-loaded backing plate of FIG. 4.

FIGS. 4 and 5 illustrate the spring-loaded backing plate assembly 100 of the present invention. The assembly 100 may include a backing plate 102 which is preferably constructed from a rigid, sturdy material such as aluminum or steel. The backing plate 102 has a sufficient thickness "T1" to provide a solid support surface for the printed circuit board 52 (FIGS. 2 and 3). For example, the thickness "T1" of the backing plate 102 may be on the order of 0.06 inches. The backing plate 102 may comprise a channel portion 104 which may be relatively U-shaped in cross-section and which is formed by a pair of retaining walls 106, 108. The retaining walls 106, 108 assist in keeping the springs 120, 122, 124, 126 in place against the backing plate 102 and greatly increase the stiffness of the backing plate 102. As noted above, the backing plate 102 may further comprise a pair of openings 110, 112 extending laterally therethrough which are adapted to receive posts 130, 132 (which may be internally-threaded a noted above and shown in a breakaway portion of post 132 in FIG. 5).

As shown in FIGS. 4 and 5, the assembly 100 may further comprise one or more leaf springs 120, 122, 124, 126, which will be described in further detail below. The leaf springs 120, etc., provide a force "F3" (FIG. 5) which compresses the printed circuit board 52, electrical connector 70, and land grid array-type device 60 together, thereby maintaining electrical contact therebetween. As shown in FIG. 3, the distance "L2" required by the springs (shown compressed) is considerably smaller than that required for comparable coil springs, thereby creating a compact assembly.

The backing plate assembly 100 may further comprise a retainer assembly 127 which functions to retain the leaf springs 120, etc. against the backing plate 102 in a preloaded state and to transfer the compressive force "F3" exerted thereby to the printed circuit board 52, the electrical connector 70, and the land grid array-type device 60 (FIGS. 2 and 3). The retainer assembly 127 may comprise a pair of posts 130, 132 and a pair of pins 154, 156 extending laterally therethrough, which are each described in further detail below. While a pair of posts 130, 132 and a pair of pins 154, 156 are shown and described herein, it is to be understood that a single post/pin assembly may be used, whereby the leaf springs 120, etc. would be cantilever springs, with one end thereof fixedly attached to the backing plate 102. However, in a preferred embodiment, the retainer assembly 127 is comprised of at least one, and possibly a plurality, of pairs of posts and pins.

As shown in FIG. 4, the leaf springs 120, 122, 124, 126 may each comprise generally rectangular openings 114, 116 extending laterally therethrough which align with the generally rectangular openings 110, 112 in the backing plate 102. The openings 114, 116 may be positioned at opposite end portions 128, 129 of the leaf springs 120, etc. in order to provide the maximum spring force "F3" (FIG. 5). Each of the posts 130, 132 (FIGS. 4 and 5) may comprise a cylindrical lower portion 134, 136 and an upper portion 138, 140 with at least one substantially flat surface (e.g., 142, 144). The upper portion 138, 140 of each post 130, 132 is adapted to extend through the generally rectangular openings 110, 112, 114, 116 in the backing plate 102 and leaf springs 120, etc. Providing one or more substantially flat surfaces 142, 144 on each post, e.g., 132, and one or more substantially flat surfaces 111, 113 on the openings, e.g., 110, in the backing plate 102 prevents the posts 130, 132 from rotating in the openings when the backing plate assembly 100 is assembled. A shelf portion, 146, 148 is formed on each post 130, 132 between the cylindrical lower portion 134, 136 and upper portion 138, 140 of each post 130, 132. This shelf portion 146 provides a "stop", i.e., the shelf portion 146 prevents the posts 130, 132 from slipping through the openings 110, 112, etc. due to the force "F3" (FIG. 5) exerted by the leaf springs 120, etc. This "stop" function, in combination with the function of the pins 154, 156 described below, allows the leaf springs 120, etc. to be preloaded in the spring-loaded backing plate assembly 100.

The posts 130, 132 may further comprise openings 150, 152 extending laterally through the upper portion 138, 140 of each post. The openings 150, 152 may be generally circular in cross-section and are adapted to receive a pair of pins 154, 156. As shown in FIG. 4, the pins 154, 156 may each comprise a recessed center portion 158, 160, respectively, which has a cross-sectional diameter slightly less than the cross-sectional diameter of the non-recessed portion of the pin. The center portion 158, 160 of each pin may extend at least the length, or preferably slightly longer than, the length "D2" of the opening (e.g., 152) in each post (e.g., 132) as shown in FIG. 4. The force "F3" (FIG. 5) exerted by the springs 120, etc. pushes the recessed center portion 158, 160 (FIG. 4) of the pins 154, 156 up against the openings 150, 152 in the posts 130, 132, thereby acting to retain the pins 154, 156 in the posts 130, 132.

There are three important considerations in determining the specific dimensions of each leaf spring 120, 122, 124, 126 (FIGS. 3 and 4). First, as described above, springs used in this application preferably have a low spring constant "K". Second, in the interest of downsizing components for today's densely-packed electronics, the surface area or "footprint" of the backing plate 102 used to hold the leaf springs is preferably not much larger than the surface area of a land grid array (e.g., 72, FIG. 2). Third, the stress exerted on the spring due to bending must be kept below the maximum bending stress tolerated by the spring. As a result of the above considerations, the leaf springs 120, 122, 124, 126 are preferably relatively thin, e.g., the thickness "T2" (FIG. 4) of each spring may be approximately 0.015 inches. The distance "D1" (FIG. 4) between the openings 114, 116 (measured from the center of each opening) may be, e.g., 1.8 inches. The width "W1" of each leaf spring 120, etc. may be, e.g., 0.6 inches. Typically, a relatively large force, e.g., on the order of 40 to 200 lbs., is required in this type of application. By stacking a plurality of relatively thin leaf springs 120, 122, 124, 126 in parallel as shown in FIGS. 3 and 4, a relatively large force "F3" is provided to oppose the anti-compressive force "F2" (FIG. 2) generated by the pads 72, 74 on the electrical connector 70 (FIGS. 1 and 2). Specifically, since each leaf spring 120, etc. deflects approximately the same distance, the force provided by each leaf spring is approximately the same. When leaf springs are stacked in parallel, these forces are added together. For example, should 40 lbs. of force be required to maintain electrical connection between the printed circuit board 52, electrical connector 70, and land grid array-type device 60, four leaf springs 120, 122, 124, 126 with the above dimensions may be utilized, each leaf spring having a spring constant of approximately 100 lbs/inch and providing approximately 10 lbs. of force.

Figure 6:
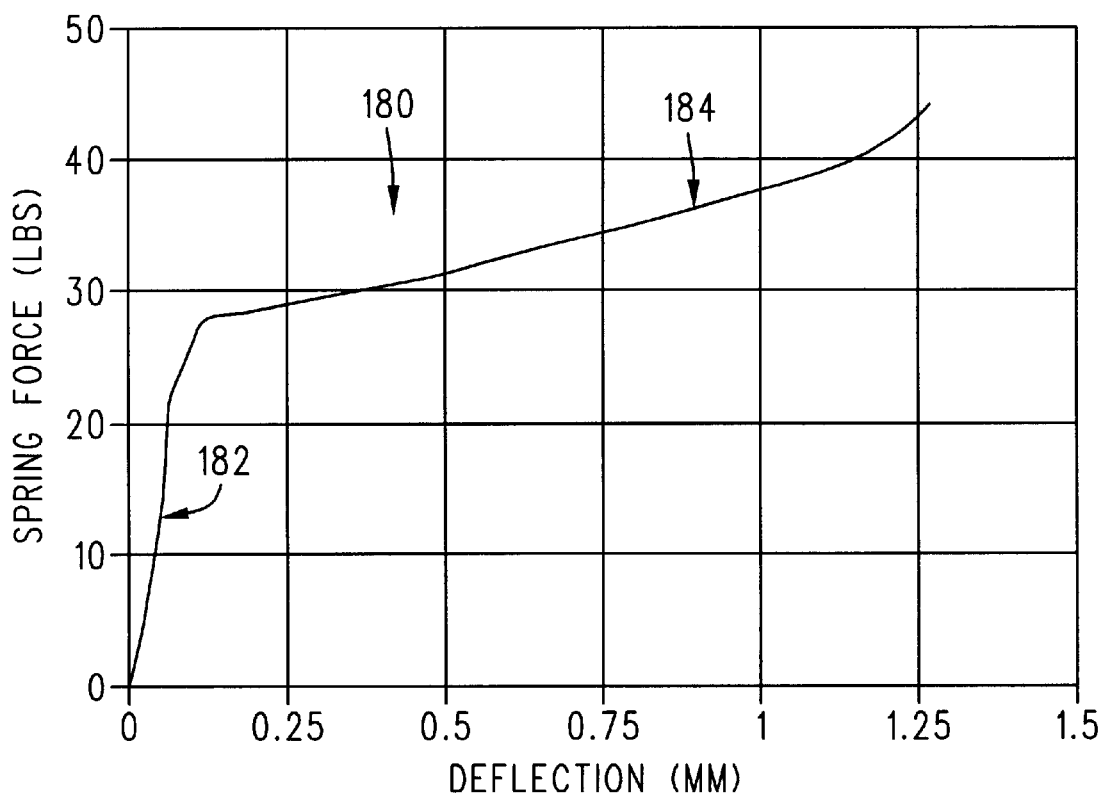
FIG. 6 is a graph illustrating the relationship between spring deflection and the amount of force exerted by the springs in the spring-loaded backing plate of FIG. 4.

FIG. 6 illustrates the relationship between spring deflection and the amount of force exerted by the springs. In this example, all four springs 120, 122, 124, 126 were used in parallel. The first, steep portion 182 of the curve 180 represents transferring the preloaded compressive force of the springs 120, 122, 124, 126 to the printed circuit board 52, the electrical connector 70, and the land grid array-type device 60 as described in further detail below with reference to FIG. 7. As shown in FIG. 6, the springs 120, etc. utilized in this example exert approximately 28 lbs. of force when in a preloaded state. The second, flatter portion 184 of the curve 180 represents further compression of the springs 120, etc. as the spring-loaded backing plate assembly 100 is being assembled onto a circuit assembly 50 (FIGS. 2 and 3).

Figure 7:
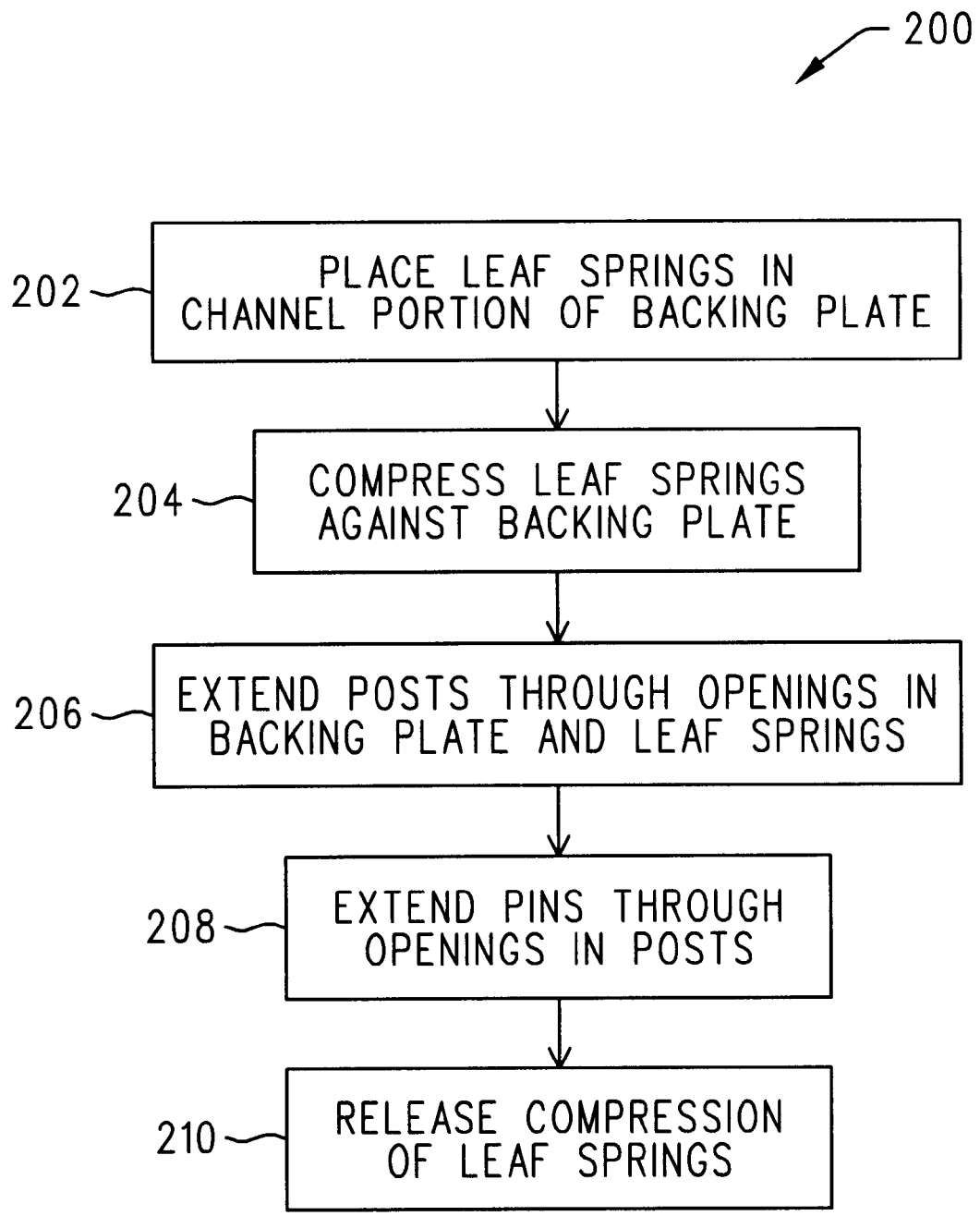
FIG. 7 is a flow chart illustrating a method for assembling the spring-loaded backing plate of the present invention.

With reference to FIGS. 2–5, a method 200 for assembling the spring-loaded backing plate assembly 100 is shown in FIG. 7. The first step 202 of the method 200 is to place the leaf springs 120, 122, 124, 126 on the backing plate 102 (specifically, in the channel portion 104 thereof. The next step 204 is to compress the leaf springs 120, etc. against the backing plate 102 using an arbor press-type mechanism (well-known in the art) or the like. The next step 206 is to extend the posts 130, 132 through the openings 110, 112, 114, 116 in the backing plate 102 and the leaf springs 120, etc. The next step 208 is to extend the pins 154, 156 through the openings 150, 152 in the posts 130, 132. The final step 210 is to release the compression of the leaf springs 120, etc. At this point, the spring-loaded backing plate assembly 100 is in a preloaded state. When the springs are released from the arbor press-type mechanism, the spring force "F3" (FIG. 5) pushes the recessed center portion 158, 160 (FIG. 4) of the pins 154, 156 up against the openings 150, 152 in the posts 130, 132, thereby acting to retain the pins 154, 156 in the posts 130, 132. The pins 154, 156, being constrained within the openings 150, 152, in the posts, exert a counter-force "F4" (FIG. 5) against the springs 120, etc., thereby holding the springs 120, etc. on the posts 130, 132 and against the backing plate 102.

Figure 8:
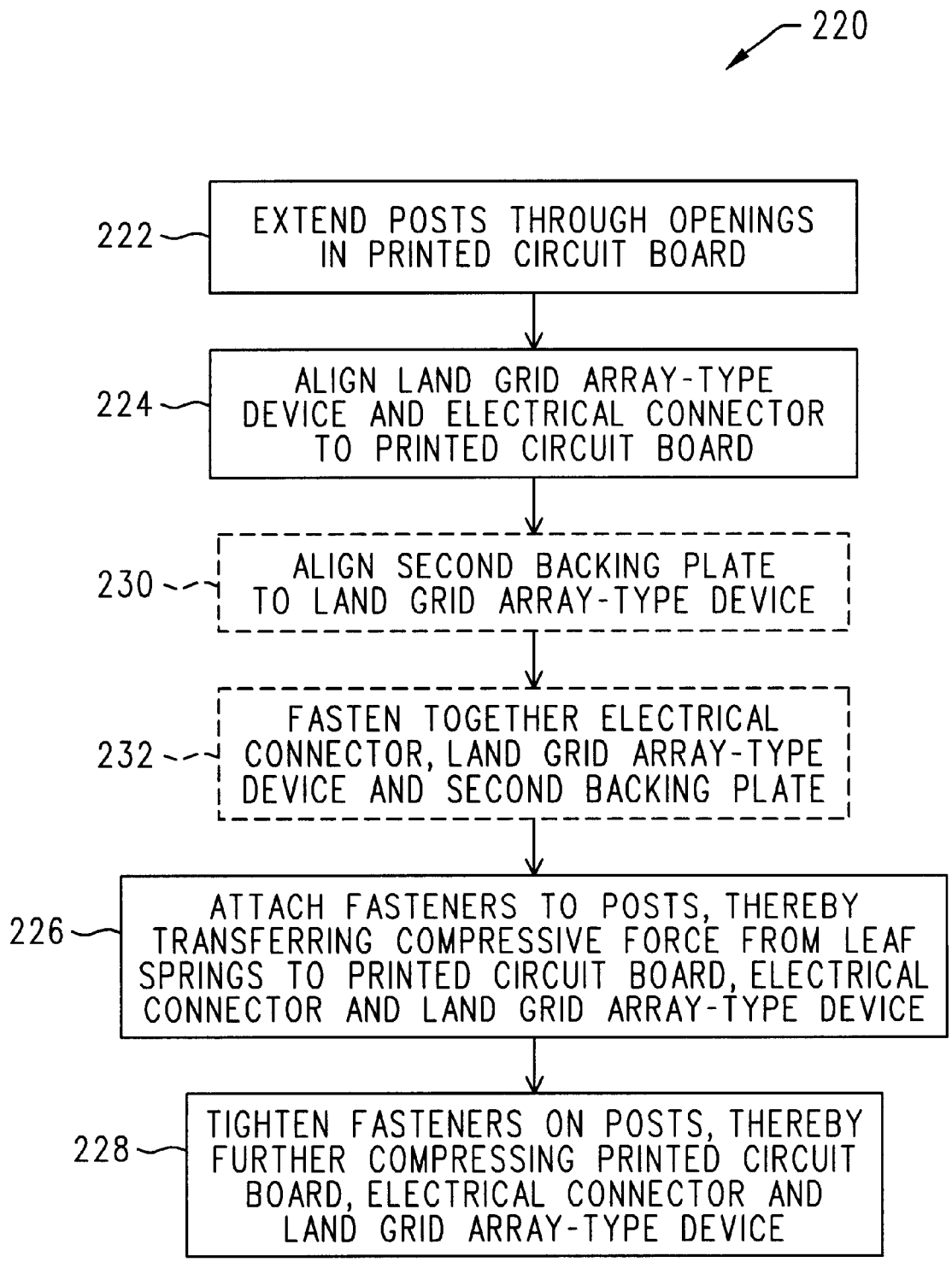
FIG. 8 is a flow chart illustrating a method for assembling a circuit assembly utilizing the spring-loaded backing plate of the present invention.

A method 220 for assembling a circuit assembly 50 utilizing a spring-loaded backing plate assembly 100 is illustrated in FIG. 8, with reference to FIGS. 2–5. The first step 222 of the method 220 is to extend the posts 130, 132 through the openings 96, 97 in the printed circuit board 52 (FIG. 2). As noted above, an insulator 83 may be positioned between the printed circuit board 52 and spring-loaded backing plate 100 prior to completion of this step. The spring force "F3" (FIG. 5), being generally perpendicular to the openings 114, 116 (FIG. 4) in the springs 120, etc., also causes the posts 130, 132 to tilt toward one another at the upper portion 138, 140, thereof and away from one another at the lower portion 134, 136 thereof when the springs 120, etc. are released. The tilt in the posts 130, 132 retains the spring-loaded backing plate assembly 100 against the printed circuit board 52 without the use of any screws or other fasteners. However, at this point, the spring-loaded backing plate assembly 100 may be secured to the printed circuit board 52 with screws 170, 172 (FIG. 2) or the like, and the following steps 224–228 of the method 200 may be completed at a future date. Also, even without screws or the like, the tilt in the posts 130, 132 holds the spring-loaded backing plate assembly 100 in place against the printed circuit board 52 as the following steps 224–228 of the method 200 are completed.

The next step 224 of the method 200 is to align the land grid array-type device 60 and the electrical connector 70 with the printed circuit board 52. The next step 226 of the method 200 is to attach each fastener 84, 85 to each of the internally-threaded posts 130, 132, thereby transferring the compressive force "F3" from the leaf springs 120, 122, 124, 126 to the printed circuit board 52, electrical connector 70, and land grid array-type device 60. The next step 228 of the method 200 is to tighten each fastener 84, 85 on each of the posts 130, 132, thereby further compressing the printed circuit board 52, electrical connector 70, and land grid array-type device 60. As the fasteners 84, 85 are tightened, the force "F4" (FIGS. 2 and 5) of the pins 156, 158 pushing against the leaf springs 120, etc. attempts to flatten the leaf springs 120, 122, 124, 126. The leaf springs 120, etc., resist this flattening force "F4" and exert a counter-force "F3" to the pins 154, 156 which is translated through the posts 130, 132 to compress the board 52, connector 70 and device 60 together. The fasteners 84, 85 may be tightened on the posts 130, 132 until the bottom surface 131 of each of the posts 130, 132 contacts the bottom surface 79 of the second backing plate 80 (or heat sink, etc.) in order to provide the proper predetermined compressive force. It will be appreciated by those skilled in the art that the connector assembly 81 (i.e., the fasteners 84, 85 and posts 130, 132) allows the leaf springs 120, etc. to provide a predetermined, constant force upon every installation of the spring-loaded backing plate assembly 100 in a circuit assembly 50. Specifically, the fasteners 84, 85 are preferably captive screws which are adapted to be screwed into the posts an adequate number of threads to get a hold thereon before any preload of the springs is transferred to the printed circuit board 52, electrical connector 70, and land grid array-type device 60 (as well as the second backing plate 80 and insulators 82, 83, if present). As the fasteners 84, 85 are screwed into the posts 130, 132 after the preload has been transferred, the leaf springs 120, 122, 124, 126 are flattened and the various components are compressed together. The fasteners 84, 85 are tightened until the bottom surface 131 of each of the posts 130, 132 abuts the bottom surface 79 of the second backing plate 80 (or heat sink, etc.). In other words, the posts 130, 132 "bottom out" on the second backing plate 80. Since no further tightening may be done without applying excessive torque when the posts "bottom out", an installer knows that the proper predetermined compressive force has then been reached.

The method 200 may comprise the further step 230 of, prior to the step 226 of attaching the fasteners 84, 85 to the posts 130, 132, aligning a second backing plate 80 (FIG. 2) with the land grid array-type device 60. As noted above, the second backing plate 80 may be part of a heat sink (not shown) or the like which includes a stiff plate member. It will be appreciated by those skilled in the art that the backing plate 102 on the spring-loaded backing plate assembly and the second backing plate 80 co-act to spread the compressive force "F3" (FIG. 5) fairly evenly across the electrical connector 70.

The method 200 may comprise the further step 232 of, prior to the step 226 of attaching the fasteners 84, 85 to the posts 130, 132, fastening together the electrical connector 70, land grid array-type device 60, and second backing plate 80 (including an insulator 82, if present). Specifically, fasteners 98, 99 such as pronged pins or the like may be utilized in order to snap these components together into a single unit prior to installing them onto the printed circuit board 52. Thus, the present invention provides a quick and easy method for assembling a circuit assembly 50 by using a printed circuit board 52 and only two other units: the spring-loaded backing plate assembly and the connector/device unit described above.

Figure 9:
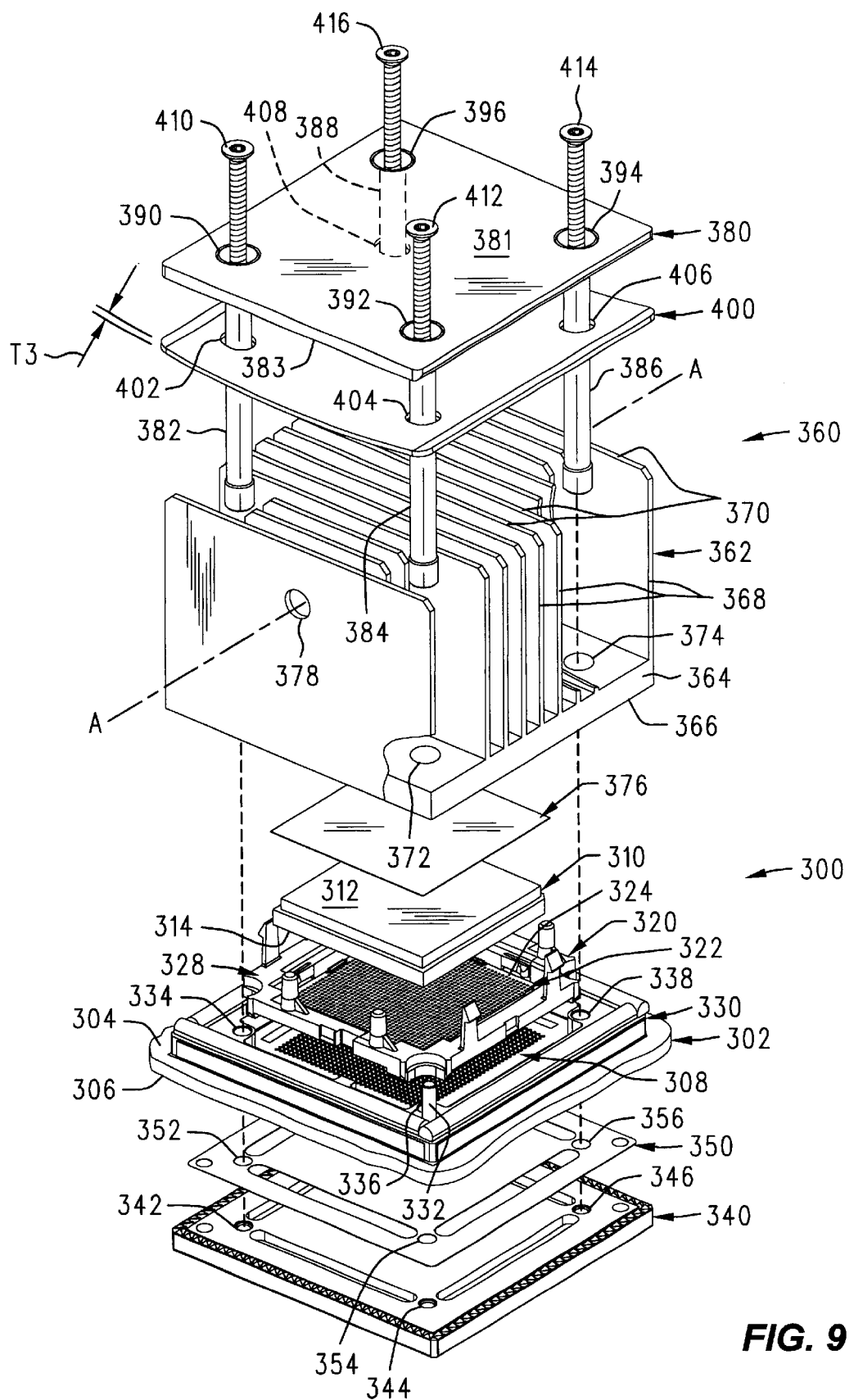
FIG. 9 is an exploded isometric view of a circuit assembly utilizing the spring-loaded heat sink assembly of the present invention.
Figure 10:
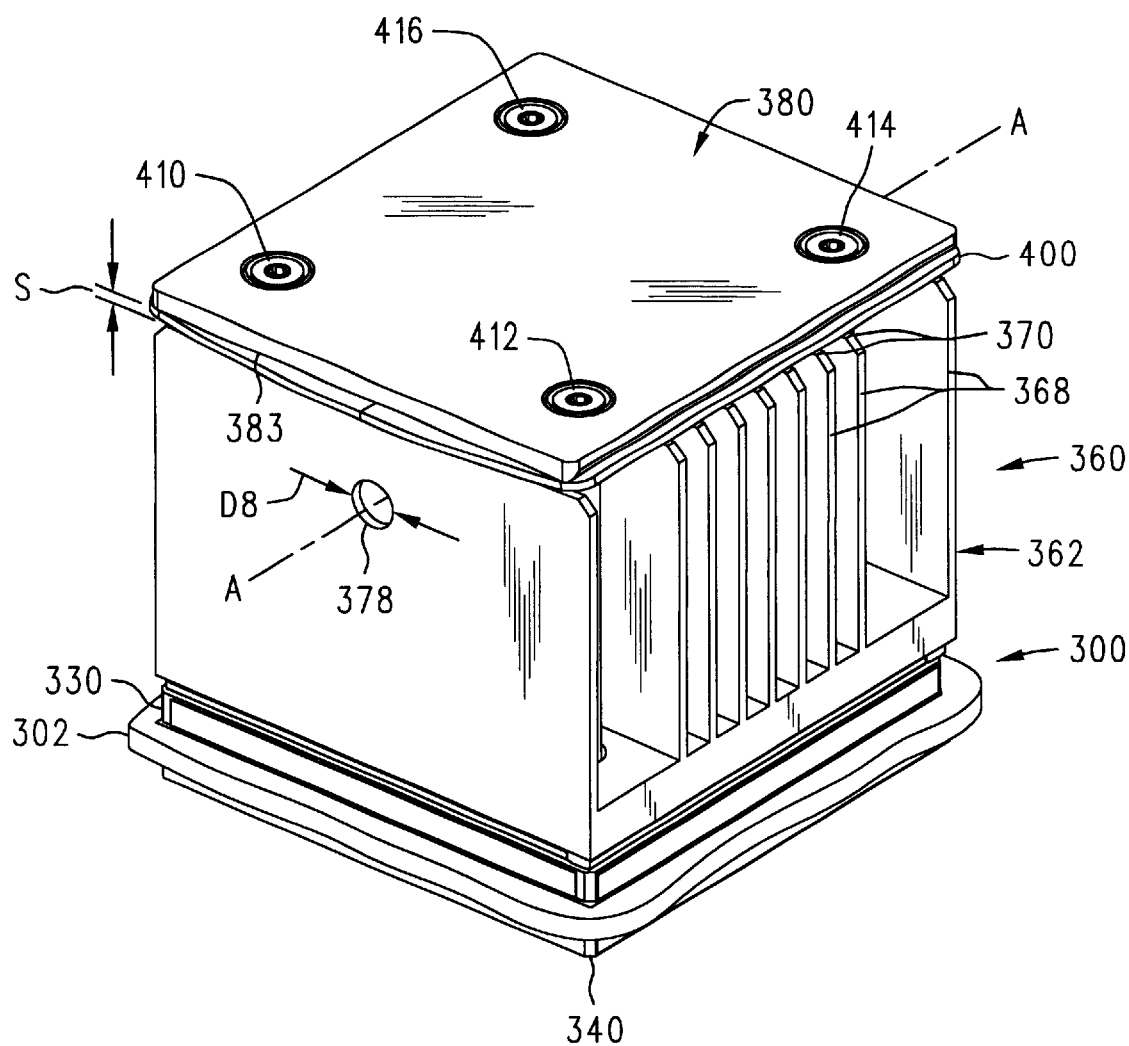
FIG. 10 is an isometric view of an assembled spring-loaded heat sink assembly and circuit assembly of FIG. 9.
Figure 11:
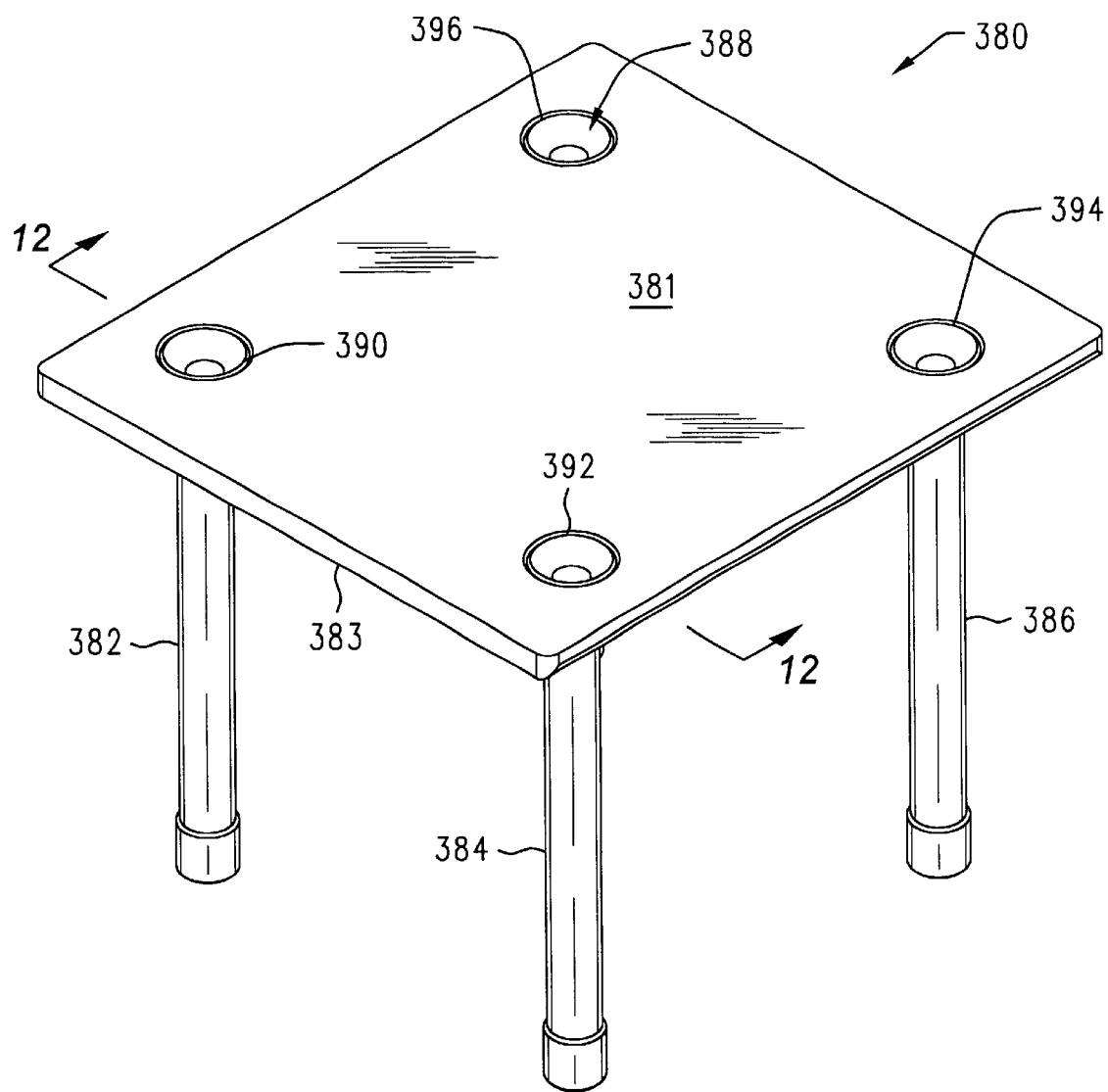
FIG. 11 is an isometric view of a load plate from the spring-loaded heat sink assembly.

FIGS. 9 and 10 illustrate a typical circuit assembly 300 which may utilize the spring-loaded heat sink assembly 360 of the present invention. As best shown in FIG. 9, the circuit assembly 300 may comprise a printed circuit (or wire) board 302 with a front side 304, a back side 306 and an array 308 of electrically conductive portions on the front side 304 thereof. Unlike the spring-loaded backing plate assembly 100 described above, the spring-loaded heat sink assembly 360 is positioned adjacent to the front side 304 of the printed circuit board 302 rather than the back side 306 thereof.

Still referring to FIG. 9, the circuit assembly 300 may further comprise a land grid array-type device 310 which may be electrically connected to the printed circuit board 302 using an electrical connector 320 or "socket". The land grid array-type device 310 may be any device such as, for example, the ASIC shown in FIG. 9 having a front side 312 and a back side 314 and having an array (not shown but substantially the same as the array 62 described above and shown in FIG. 3) of electrically conductive portions on the back side 314 thereof. The electrical connector 320 may be of a type well-known in the art (such as the electrical connector 70 described above) which comprises a first side 324 and a second side (not shown) and an array 322 of electrically conductive portions on each side (e.g., 324) thereof. As shown in FIG. 9, the electrical connector 320 may further comprise a frame 326 well-known in the art which assists in positioning the land grid array-type device 310 and securing it to the electrical connector 320. When assembled, the connector array 322 on the first side 324 of the electrical connector 320 abuts the array (not shown) on the back side 314 of the land grid array-type device 310, and the array (not shown) on the second side (not shown, but opposite the first side) of the electrical connector 320 abuts the array 308 of electrically conductive portions on the front side 304 of the printed circuit board 302.

The circuit assembly 300 may further comprise an electromagnetic interference (EMI) frame 330 for the commonly-known purpose of containment of electromagnetic energy produced by the land grid array-type device 310. The EMI frame 330 may comprise one or more (and preferably at least a pair of) alignment pins 332 (only one shown in FIG. 9) which assists in aligning and non-adhesively securing the spring-loaded heat sink assembly 360 to the circuit assembly 300. The EMI frame 330 may further comprise a plurality of openings 334, 336, 338 (only three shown) which extend through the EMI frame 330 and the printed circuit board 302 and are adapted to receive a plurality of fasteners 410, 412, 414, 416 such as threaded screws or the like.

The circuit assembly 300 may further comprise a backing plate 340 having a plurality of openings 342, 344, 346 (only three shown) therethrough. The backing plate 340 assists in connecting the heat sink assembly 360 to the circuit assembly 300 and provides support to the components. The openings 342, 344, 346 (and a fourth opening, not shown) may be threaded in order to receive and secure the fasteners 410, 412, 414, 416, which may be threaded screws as noted above. An insulator 350 may be disposed between the printed circuit board 302 and the backing plate 340 in order to prevent electrical contact therebetween, as described above relative to the insulators 82, 83. As shown in FIG. 9, the insulator 350 may comprise a plurality of openings 352, 354, 356 (only three shown) which are adapted to allow the fasteners 410, 412, 414, 416 to pass therethrough.

As best shown in FIG. 9, the spring-loaded heat sink assembly 360 of the present invention may comprise a heat sink 362, which may be any type of heat sink including those well-known in the art. The heat sink 362 may comprise a base 364 having a flat bottom surface 366 and a plurality of fins 368. The heat sink 362 also has an uppermost surface 370, which, as shown in FIG. 9, may be comprised of the top surface of the plurality of fins 368, or may be any other uppermost surface on a conventional heat sink. The base 364 may comprise a plurality of openings 372, 374 (only two shown in breakaway portions in FIG. 9) adapted to receive elongate shafts 362, 364, 366, 368 described below. When assembled, the bottom surface 366 of the base 364 remains in thermal contact with the front side 312 of the land grid array-type device 310. Most preferably, the heat sink 362 is allowed to "float" on the land grid array-type device 310, i.e., the heat sink 362 is not adhesively attached to the device 310. Thermal interface material 376 may be placed between the heat sink 362 and the land grid array-type device 310 to assist in transferring heat from the land grid array-type device 310 to the heat sink 362, as is well-known in the art. The heat sink 362 may also comprise an opening 378 which is adapted to receive an attachment pin 448 of an installation tool 440 (FIGS. 13 and 14, described in further detail below). Each of the fins 368 preferably has an identical opening (e.g., 378) located along a central axis "AA" (FIGS. 9, 10 and 13) so that the attachment pin 448 may be extended entirely through the heat sink 362, as described in further detail below.

Referring to FIGS. 9–12, the spring-loaded heat sink assembly 360 may further comprise a load plate 380 having an upper surface 381, a lower surface 383, and a plurality of elongate shafts 382, 384, 386, 388 attached to or integrally formed with the load plate 380. The elongate shafts 382, 384, 386, 388 are concentric with (and may be integrally formed with) openings 390, 392, 394, 396, respectively, on the upper surface 381 of the load plate 380. The elongate shafts 382, etc., are preferably substantially identical to one another, and a description of one of the elongate shafts 382 below is applicable to each of the elongate shafts 382, 384, 386, 388.

As shown in FIG. 9, the spring-loaded heat sink assembly 360 also comprises at least one leaf spring 400 having a plurality of openings 402, 404, 406, 408 therethrough. The leaf spring(s) 400 is/are positioned between the lower surface 383 of the load plate 380 and the uppermost surface 370 of the heat sink 362. When assembled (see FIG. 10), the elongate shafts 382, 384, 386, 388 (FIG. 9) extend through the openings in the leaf spring(s) (e.g., 402, 404, 406) and the openings in the heat sink (e.g., 372, 374). In order to allow for deflection of the leaf spring(s) 400 while the leaf spring(s) 400 is/are mounted on the elongate shafts 382, 384, 386, 388, the openings 402, 404, 406, 408 therethrough are preferably elongated (e.g., oval as shown in FIG. 9, slotted, or the like). Like the leaf springs 120, 122, 124, 126 discussed above, each of the leaf spring(s) 400 is preferably relatively thin, e.g., the thickness "T3" (FIG. 9) of each spring may be approximately 0.015 inches. In the embodiment of FIGS. 9–16, a compressive force on the order of, for example, approximately 300 lbs. may be required. Thus, in this example, a single leaf spring 400 having a spring constant of approximately 1,300 lbs./inch and providing approximately 300 lbs. of force may be utilized. However, as noted below, two or more springs may be positioned in parallel to one another in order to provide more compressive force if necessary.

Figure 12:
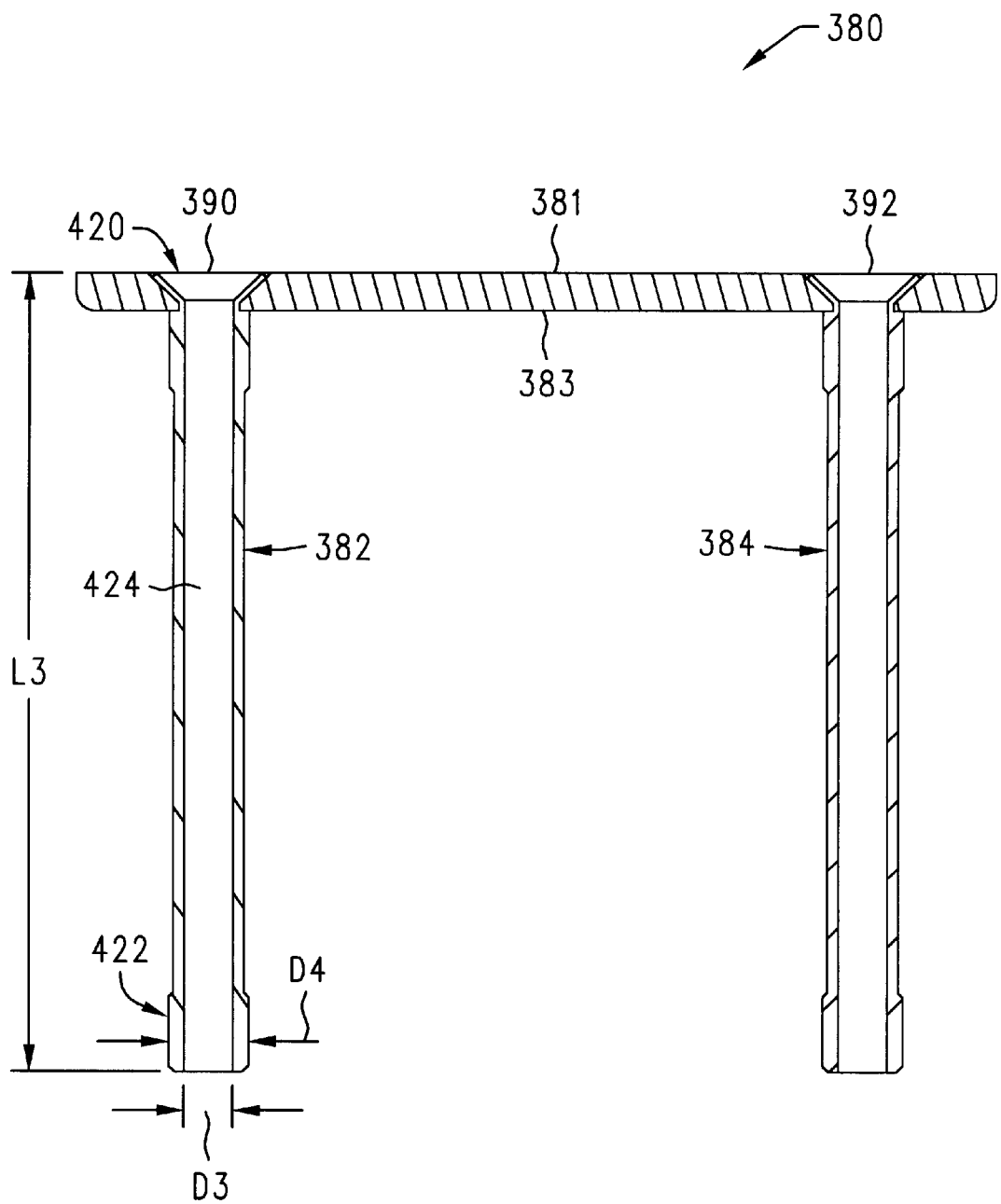
FIG. 12 is a sectional view of the load plate of FIG. 11.

As best shown in FIG. 12 which is a sectional view of the load plate 380, each of the elongate shafts (e.g., 382) has an upper end portion 420, a lower end portion 422, and an open channel 424 extending from the upper end portion 420 to the lower end portion 422. The channel 424 has an inner diameter "D3" which is adapted to receive a fastener (e.g., 410, FIG. 9). The upper end portion 420 may be flared as shown in FIG. 12 in order to allow the fastener 410 to be countersunk into the load plate 380, as best shown in FIG. 10. The lower end portion 422 has an outer diameter "D4" which is larger than the openings (e.g., 334) in the EMI frame 330. Thus, when assembled, the elongate shafts 382, 384, 386, 388 contact or "bottom out at" the EMI frame 330 while allowing the fasteners 410, 412, 414, 416 to extend through the elongate shafts 382, etc., the openings 334, etc., in the EMI frame, the openings 352, etc., in the insulator 350, and the openings 342, etc., in the backing plate 340. As noted above, if using threaded screws for the fasteners 410, etc., the openings 342, etc., in the backing plate 340 may be threaded in order to secure the fasteners 410, etc.

When assembled, the elongate shafts 382, 384, 386, 388 extend from the load plate 380 to the EMI frame 330 and function as "spacers" between these components. Thus, the preferred length "L3" (FIG. 12) of the elongate shafts 382, etc., is determined by the distance required between the load plate 380 (FIGS. 9 and 10) and the EMI frame 330. With the fasteners 410, 412, 414, 416 tightened as shown in FIG. 10, the preferred length "L3" (FIG. 12) of the elongate shafts 382, 384, 386, 388 will provide a small space "S" (FIG. 10) between the load plate 380 and the heat sink 362. The size of this space "S" will determine how much the leaf spring(s) 400 will be compressed or "flattened out" against the uppermost surface 370 of the heat sink 362 and the bottom surface 383 of the load plate 380. The more the leaf spring(s) 400 is/are compressed, the more the spring(s) 400 deflect, thus exerting more compressive force on the heat sink 362 and circuit assembly 300. Thus, if a greater compressive force is required, the space "S" may be reduced by shortening the length "L" of the elongate shafts 382, etc., thereby deflecting the spring(s) 400 more. Alternately, if a significantly greater compressive force is required, the space "S" may be increased by lengthening the elongate shafts 382, etc., and one or more leaf springs may be added in parallel to one another, thereby increasing the total compressive force as discussed above relative to leaf springs 120. If a lesser compressive force is required, the space "S" may be increased without adding any leaf springs, thus lessening the deflection of the leaf spring(s) 400.

Figure 13:
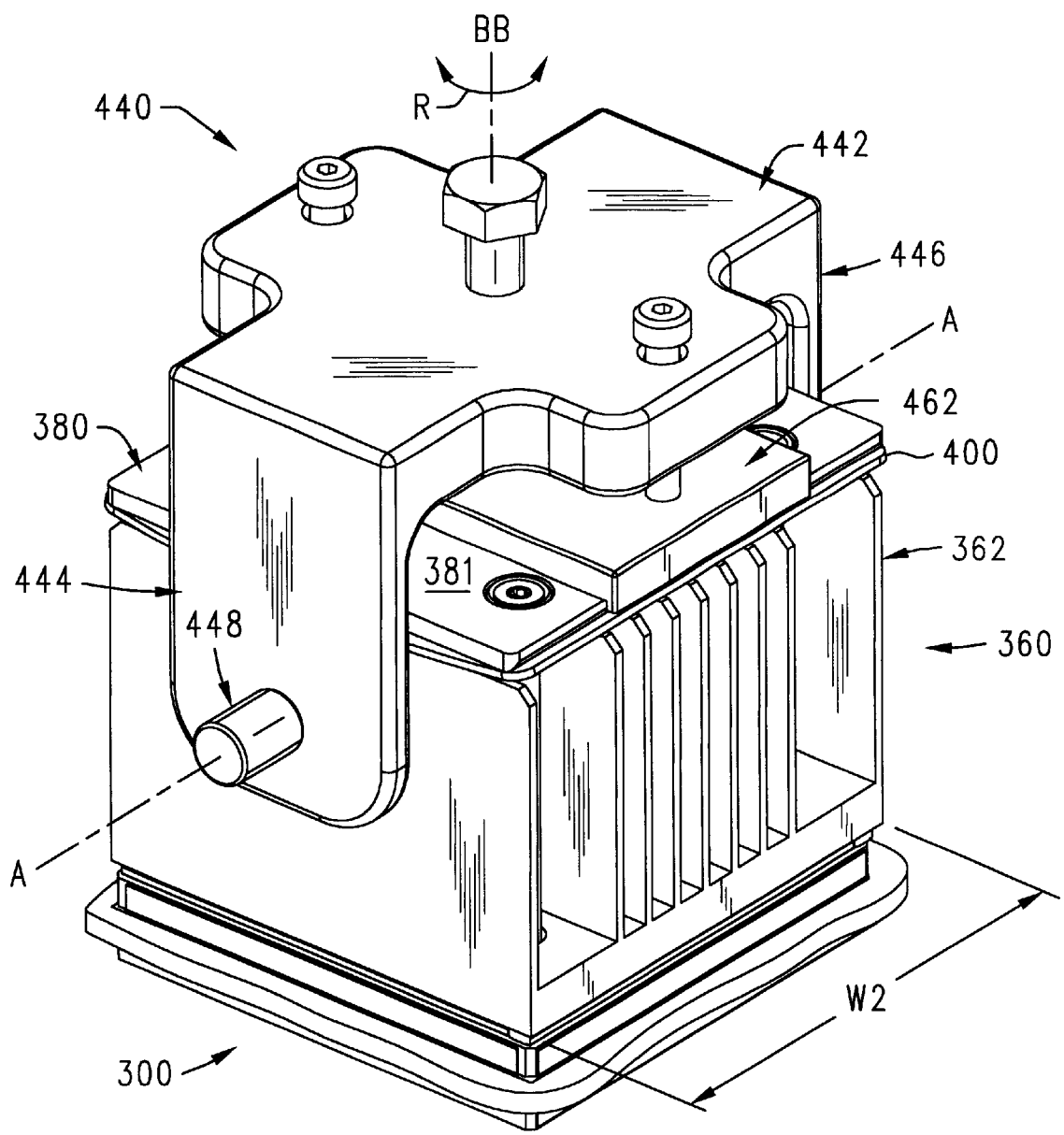
FIG. 13 is an isometric view of an installation tool mounted on the spring-loaded heat sink assembly and circuit assembly of FIG. 10.
Figure 14:
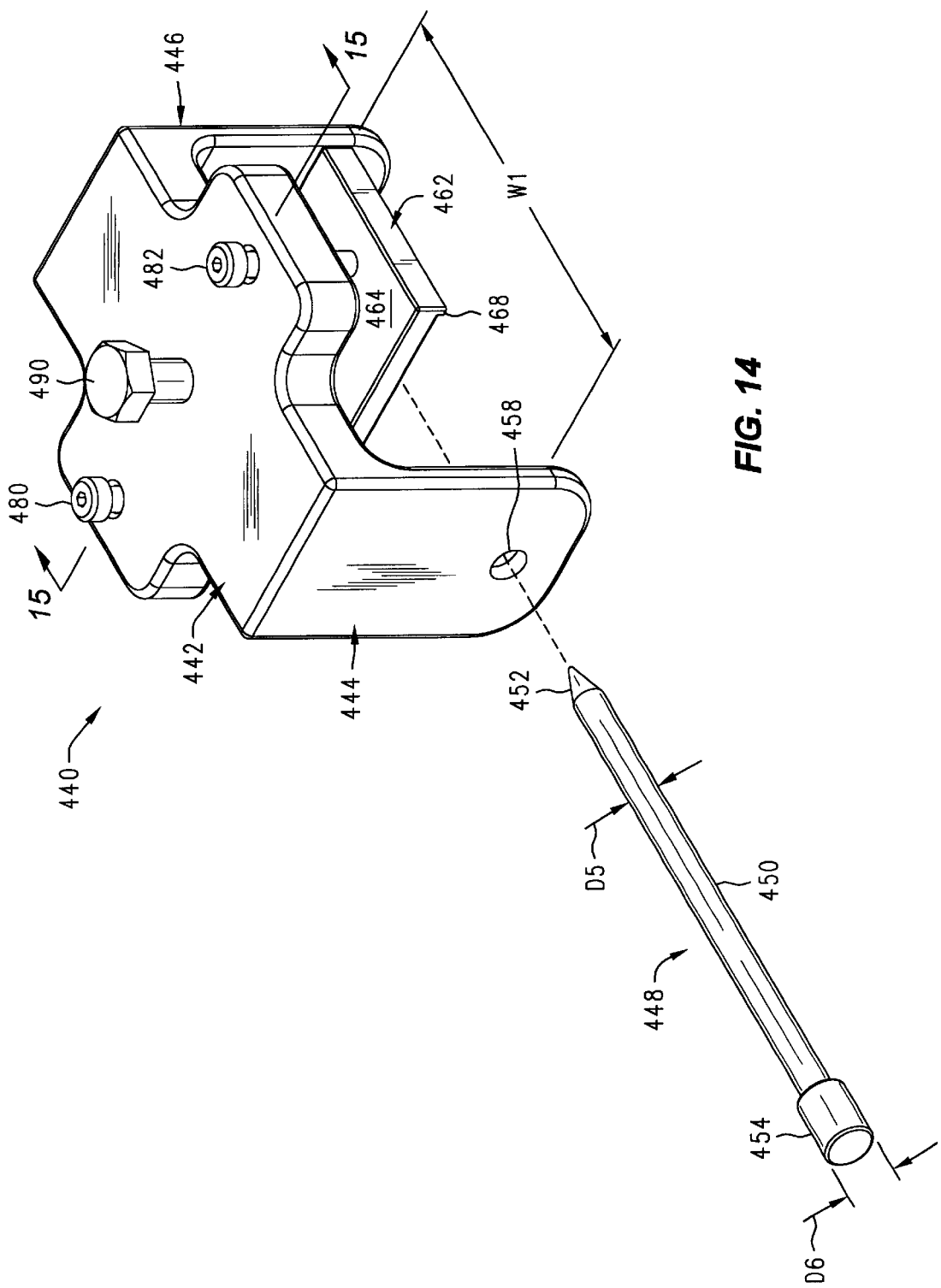
FIG. 14 is an isometric view of the installation tool of FIG. 13.

FIG. 13 illustrates an installation tool 440 attached to the spring-loaded heat sink assembly 360 and circuit assembly 300. As described in further detail below, the installation tool 440 may be utilized to install or remove the spring-loaded heat sink assembly 360 onto/from the circuit assembly 300. As shown in FIGS. 13 and 14, the installation tool 440 may comprise an upper portion 442, a first side portion 444 and a second side portion 446. The first and second side portions 444, 446 are separated from one another to form a space between these portions 444, 446 having a width "W2" (FIG. 14) which is preferably somewhat larger than the width "W3" (FIG. 13) of the heat sink 362 so that the installation tool 440 may be mounted on the heat sink assembly 360 as shown in FIG. 13 and described below.

Figure 15:
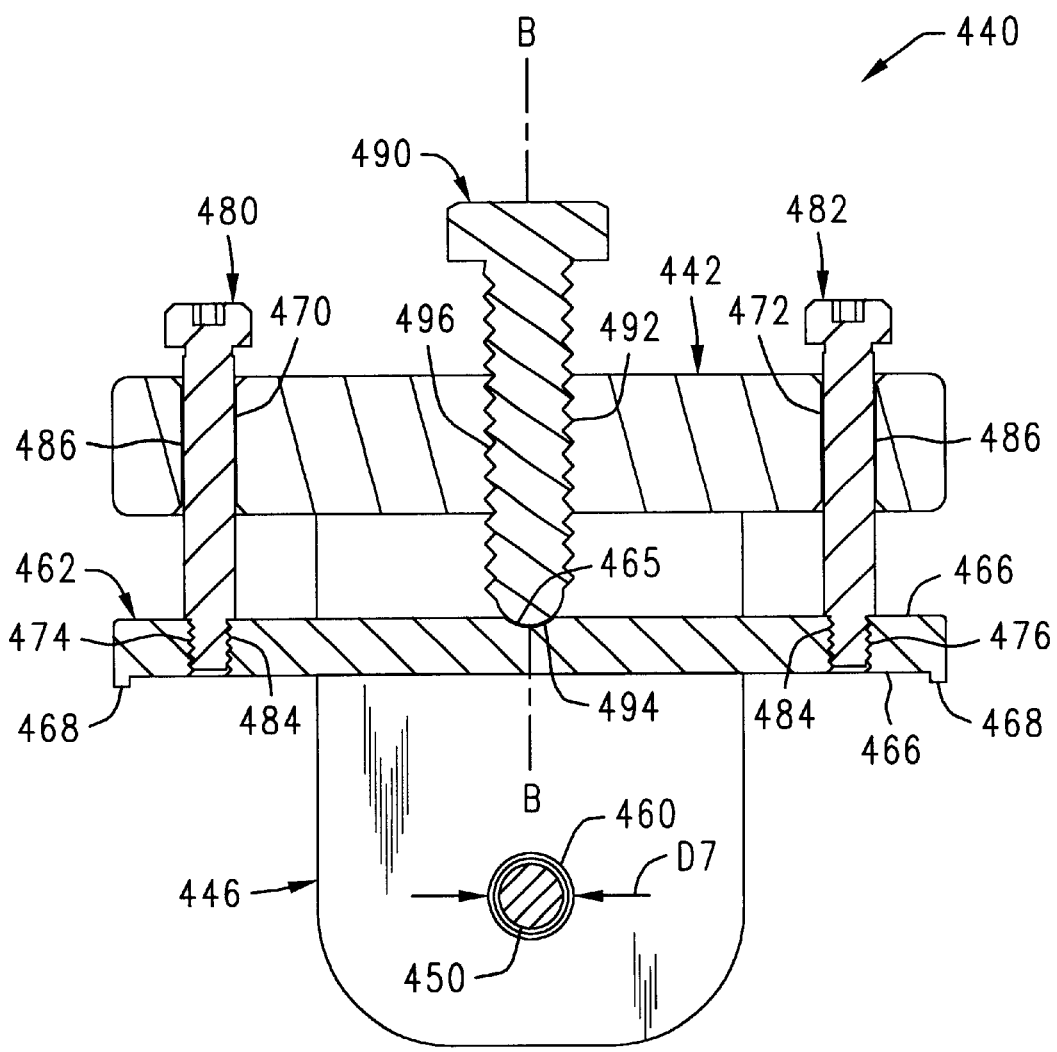
FIG. 15 is a sectional view of the installation tool of FIG. 13.

Referring to FIGS. 13–15, the tool 440 may further comprise an attachment pin 448 which may removably extend through openings 458 (FIG. 14), 460 (FIG. 15) in the first side portion 444 and the second side portion 446 of the tool 440. The attachment pin 448 may also be adapted to extend entirely through the heat sink 362 via the opening 378 (FIGS. 9 and 10) in each cooling fin 368 as described above. As best shown in FIG. 14, the attachment pin 448 may comprise an elongate rod 450 having a first end 452 (which may be tapered as shown) and a stop portion 454. The elongate rod 450 is adapted to be easily inserted into the openings 378, 458, 460, i.e., the elongate rod 450 may have a diameter "D5" which is preferably somewhat smaller than the diameter "D7" (FIG. 15) of the openings 458, 460 in each of the side portions 444, 446 so that the rod 450 may easily pass through these openings 458, 460. Similarly, the diameter "D5" of the elongate rod 450 is preferably somewhat smaller than the diameter "D8" (FIG. 10) of the openings 378 in the fins 368. The stop portion 454 may have a larger diameter "D6" (FIG. 14) than the diameter "D7" (FIG. 15) of the openings 458, 460 in order to act as a "stop" when the attachment pin 448 is fully extended through the heat sink 362 and tool 440.

Still referring to FIGS. 13–15, the tool 440 may further comprise a lower plate 462 having an upper surface 464 and a lower surface 466 (FIG. 15). The lower surface 466 of the lower plate 462 is adapted to contact the upper surface 381 of the load plate 380, as shown in FIG. 13. The lower plate 462 may also comprise flanges 468 which assist the lower plate 462 in maintaining a secure hold on the load plate 380, also as shown in FIG. 13. As best shown in FIG. 15, the upper portion 442 may have openings 470, 472 extending therethrough which are adapted to slidably receive fasteners 480, 482 such as screws. The fasteners 480, 482 may be adapted to be securely yet removably attached to the lower plate 462, i.e., the fasteners 480, 482 may be threaded at least on a lower portion 484 thereof. The lower plate 462 may have openings 474, 476 extending at least partially therethrough which are adapted to receive the fasteners 480, 482, i.e., the openings 474, 476 may be threaded. The fasteners 480, 482 are also adapted to securely yet movably connect the upper portion 442 of the installation tool 440 to the lower plate 462. For example, the openings 470, 472 in the upper portion 442 may comprise a constricted center portion 486 having a diameter which is nearly identical to the diameter of each of the fasteners 480, 482.

The tool 440 may further comprise an actuation device 490 which is adapted to apply force to the lower plate 462 which, in turn, evenly applies compressive force to the load plate 380 (FIGS. 9–12), which then evenly compresses the leaf spring(s) 400 (FIGS. 9–10). The actuation device 490 is adjustable in order to move the lower plate 462 relative to the upper portion 442. The actuation device 490 may be a screw or the like having a threaded center portion 492 and an end portion 494 which contacts the upper surface 464 of the lower plate 462. As indicated in FIG. 15, the actuation device 490 may contact an indented portion 465 of the upper surface 464, the indented portion 465 preferably being centrally located on the upper surface 464. The actuation device 490 may be received within a opening 496 preferably centrally located on the upper portion 442. If the actuation device 490 is a threaded screw, the opening 496 in the upper portion 442 may be also be threaded. As shown in FIG. 15, the actuation device 490 may be oriented along a central axis "BB". Rotating the actuation device 490 in a rotational direction "R" may raise or lower the actuation device 490. Lowering the actuation device 490 applies force to the lower plate 462 and evenly compresses the spring(s) 400 (FIGS. 9, 10 and 13), thereby evenly applying compressive force to the heat sink 362 and circuit assembly 300 (FIG. 10). Raising the actuation device 490 allows the spring(s) 400 to return to an undeflected state, thereby removing compressive force from the heat sink 362 and circuit assembly 300 (FIG. 10). At any time prior to use, the installation tool 440 may be prepared by removing the attachment pin 448 from the tool 440 as shown in FIG. 14 and raising the actuation device 490 so that the spring(s) remain in a relatively undeflected state as the tool 440 is mounted on the heat sink assembly 360.

Figure 16:
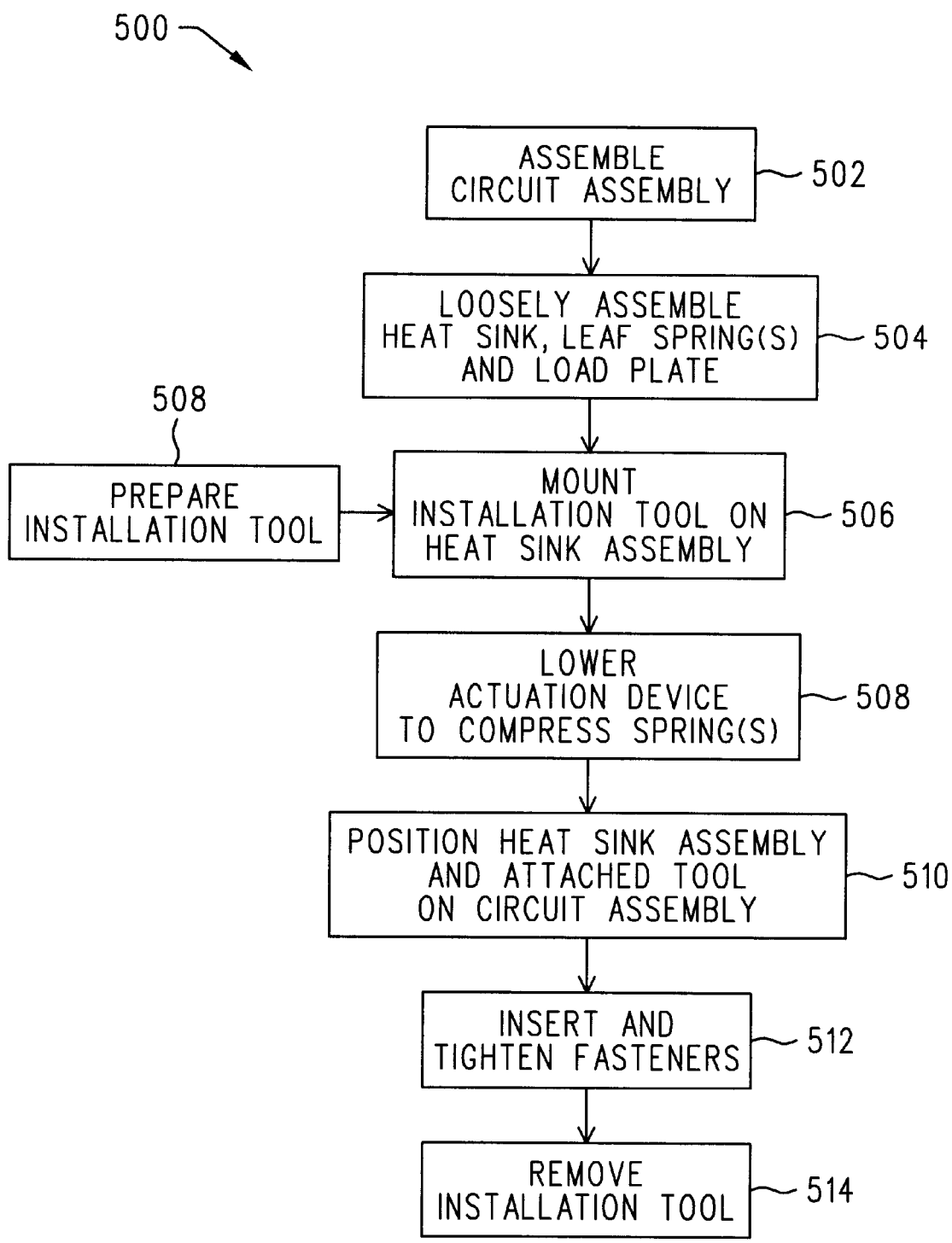
FIG. 16 is a flow chart illustrating installation of the heat sink assembly onto a circuit assembly.

FIG. 16 (with reference to FIGS. 9–15) illustrates a method 500 for installing a spring-loaded heat sink assembly 360 on a circuit assembly 300 using an installation tool 440. The method may comprise the initial step 502 of assembling the circuit assembly 300, which may consist of putting together a backing plate 340, insulator 350, EMI frame 330, electrical connector 320, and land grid array-type device 310. The next step 504 involves loosely assembling the heat sink 362, leaf spring(s) 400, and load plate 380. The next step 506 involves mounting the installation tool 440 on the heat sink assembly 360. This may be accomplished by suspending the tool 440 over the heat sink 362, aligning the openings 458 (FIG. 14), 460 (FIG. 15) in the tool with the openings 378 (FIGS. 9 and 10) in the heat sink 362, and inserting the attachment pin 448 in the tool 440 and heat sink 362. The attachment pin 448 may be inserted through an opening (e.g., 460) in a first side portion (e.g., 444) of the tool 440, each of the openings 378 in the heat sink 362, and the opening (e.g., 460) in a second side portion (e.g., 446) of the tool 440 as shown in FIGS. 13 and 14. As indicated at 508 in FIG. 16 and noted above, at any time prior to mounting the installation tool 440 on the heat sink assembly 360, the installation tool may be prepared by removing the attachment pin 448 therefrom. The next step 510 involves lowering the actuation device 490 in order to lower the plate 462 (with the lower plate 462 being adjusted as necessary to obtain a secure hold on the load plate 380) and compress the spring(s) 400. In the next step 512, when the desired amount of compression is achieved, the heat sink assembly 360 with the installation tool 440 still mounted thereon may be aligned on the circuit assembly 300, with thermal interface material 376 inserted therebetween if desired. As noted above, one or more (and preferably at least a pair of) alignment pins 332 (only one shown in FIG. 9) on the EMI frame 330 may be utilized to assist in positioning the heat sink assembly 360 on the circuit assembly 300. The next step 514 involves inserting the fasteners 410, 412, 414, 416 through the openings 390, 392, 394, 396 in the load plate 380; openings 402, 404, 406 in the spring(s) 400; openings 372, 374 in the heat sink 362; openings 334, 336, 338 in the EMI frame 330; openings (not shown) in the printed circuit board 302; openings 352, 354, 356 in the insulator 350; and openings 342, 344, 346 in the backing plate 340. The fasteners 410, 412, 414, 416 may then be tightened completely, resulting in a heat sink assembly 360 attached to a circuit assembly 300 with an installation tool 440 mounted thereon as shown in FIG. 13. In the final step 516, the installation tool 440 may then be removed (by first removing the attachment pin 448), thereby resulting in a heat sink assembly 360 attached to a circuit assembly 300 as shown in FIG. 10.

In order to remove a heat sink assembly 360 from a circuit assembly 300, the installation tool 440 (previously prepared for use by removing the attachment pin 448) is mounted on the heat sink assembly 360 in the same manner as discussed above. The actuation device 490 is lowered until the lower plate 462 has a secure hold on the load plate 380. With the installation tool 440 mounted on the heat sink assembly 360, the fasteners 410, 412, 414, 416 may be loosened and removed without damaging the circuit assembly components. The heat sink assembly 360 may then be removed from the circuit assembly 300 with the installation tool 440 still mounted thereon (in order to, for example, install the heat sink assembly 360 onto another circuit assembly 300). Otherwise, the heat sink assembly 360 may then be dismantled by raising the actuation device 490 to unload the spring(s) 400, and the installation tool 440 may then be removed.

While illustrative and presently preferred embodiments of the invention have been described in detail herein, it is to be understood that the inventive concepts may be otherwise variously embodied and employed and that the appended claims are intended to be construed to include such variations except insofar as limited by the prior art.

We claim:

1. A spring-loaded heat sink assembly for a circuit assembly, comprising:
    a) a heat sink having a base portion, a plurality of cooling fins, and an uppermost surface on said plurality of cooling fins;
    b) at least one leaf spring positioned adjacent to said uppermost surface of said heat sink; and
    c) a load plate positioned adjacent to said at least one leaf spring, said load plate comprising a plurality of elongate shafts fixedly attached thereto, said plurality of elongate shafts removably extending through said at least one leaf spring and said heat sink and at least partially through said circuit assembly, each of said plurality of elongate shafts comprising an open channel extending therethrough.

2. The spring-loaded heat sink assembly of claim 1 further comprising a plurality of fasteners extending through said open channel of said elongate shafts and at least partially through said circuit assembly, said plurality of fasteners removably connecting said spring-loaded heat sink assembly to said circuit assembly.

3. The spring-loaded heat sink assembly of claim 2, said at least one leaf spring comprising a plurality of elongate openings for receiving said plurality of fasteners when said at least one leaf spring is in an undeflected state.

4. The spring-loaded heat sink assembly of claim 1 wherein said plurality of elongate shafts are integrally formed with said load plate.

5. The spring-loaded heat sink assembly of claim 1 wherein each of said elongate shafts comprises a flared upper end portion and a lower end portion, said open channel extending from said flared upper end portion to said lower end portion.

6. A spring-loaded heat sink assembly and circuit assembly, said circuit assembly having a printed circuit board, an electrical connector, and a land grid array-type device, comprising:
    a) a heat sink having a base portion in thermal contact with said land grid array-type device and a plurality of cooling fins;
    b) at least one leaf spring positioned adjacent to said cooling fins;
    c) a load plate positioned adjacent to said at least one leaf spring;
    d) a plurality of elongate shafts extending from said load plate to at least said land grid array-type device, said plurality of elongate shafts extending through said heat sink and said at least one leaf spring, each of said plurality of elongate shafts having an open channel extending therethrough;
    e) a plurality of fasteners, each of said plurality of fasteners extending through said open channel in said plurality of elongate shafts, removably connecting said spring-loaded heat sink assembly to said circuit assembly.

7. The spring-loaded heat sink assembly of claim 6 wherein said circuit assembly further comprises an electromagnetic interference frame mounted on said printed circuit board and a backing plate, wherein:
    a) said plurality of elongate shafts extend from said load plate to said electromagnetic interference frame; and
    b) said plurality of fasteners extend through said electromagnetic interference frame and said printed circuit board and are removably attached to said backing plate.

8. The spring-loaded heat sink assembly of claim 6, said at least one leaf spring comprising a plurality of elongate openings for receiving said plurality of fasteners when said at least one leaf spring is in an undeflected state.

9. The spring-loaded heat sink assembly of claim 6 wherein said plurality of elongate shafts are integrally formed with said load plate.

10. The spring-loaded heat sink assembly of claim 6 wherein each of said elongate shafts comprises a flared upper end portion and a lower end portion, said open channel extending from said flared upper end portion to said lower end portion.

* * * * *